(12) United States Patent
Yamazaki et al.

(10) Patent No.: US 9,257,569 B2
(45) Date of Patent: Feb. 9, 2016

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Jun Koyama, Kanagawa (JP); Kiyoshi Kato, Kanagawa (JP)

(73) Assignee: Semiconductor Energy Laboratory Co. Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/060,447

(22) Filed: Oct. 22, 2013

(65) Prior Publication Data
US 2014/0110704 A1    Apr. 24, 2014

(30) Foreign Application Priority Data

Oct. 23, 2012  (JP) ................... 2012-234203
Nov. 14, 2012  (JP) ................... 2012-249839

(51) Int. Cl.
*H01L 29/786*  (2006.01)
*H01L 29/788*  (2006.01)
*H01L 27/115*  (2006.01)

(52) U.S. Cl.
CPC .......... *H01L 29/788* (2013.01); *H01L 27/1156* (2013.01); *H01L 29/7869* (2013.01); *H01L 29/78645* (2013.01)

(58) Field of Classification Search
CPC .................. H01L 51/0554; H01L 29/78645
USPC ........................................................ 257/365
See application file for complete search history.

(56) References Cited

U.S. PATENT DOCUMENTS 4,466,081 A   8/1984   Masuoka
5,731,856 A   3/1998   Kim et al.
(Continued)

FOREIGN PATENT DOCUMENTS

EP   1 737 044 A1   12/2006
EP   2 226 847 A2    9/2010
(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
(Continued)

*Primary Examiner* — David Vu
(74) *Attorney, Agent, or Firm* — Fish & Richardson P.C.

(57) ABSTRACT

A semiconductor device includes an oxide layer, a source electrode layer in contact with the oxide layer, a first drain electrode layer in contact with the oxide layer, a second drain electrode layer in contact with the oxide layer, a gate insulating film in contact with the oxide layer, a first gate electrode layer overlapping with the source electrode layer and the first drain electrode layer and overlapping with a top surface of the oxide layer with the gate insulating film interposed therebetween, a second gate electrode layer overlapping with the source electrode layer and the second drain electrode layer and overlapping with the top surface of the oxide layer with the gate insulating film interposed therebetween, and a third gate electrode layer overlapping with a side surface of the oxide layer with the gate insulating film interposed therebetween.

23 Claims, 16 Drawing Sheets

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,919,601 B2 | 7/2005 | Inaba |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,696,583 B2 | 4/2010 | Shin |
| 7,732,819 B2 | 6/2010 | Akimoto et al. |
| 7,781,760 B2 | 8/2010 | Nakamura et al. |
| 7,791,072 B2 | 9/2010 | Kumomi et al. |
| 7,884,360 B2 | 2/2011 | Takechi et al. |
| 7,892,898 B2 | 2/2011 | Oba |
| 7,994,579 B2 | 8/2011 | Itai |
| 8,148,779 B2 | 4/2012 | Jeong et al. |
| 8,203,143 B2 | 6/2012 | Imai |
| 8,237,166 B2 | 8/2012 | Kumomi et al. |
| 8,420,442 B2 | 4/2013 | Takechi et al. |
| 8,502,216 B2 | 8/2013 | Akimoto et al. |
| 8,963,148 B2 | 2/2015 | Matsubayashi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0194839 A1 | 10/2003 | Chung |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0051843 A1 | 3/2005 | Inaba |
| 2005/0199959 A1 | 9/2005 | Chiang et al. |
| 2006/0030089 A1 | 2/2006 | Chung |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0169462 A1 | 7/2008 | Nakamura et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0072233 A1 | 3/2009 | Hayashi et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142887 A1 | 6/2009 | Son et al. |
| 2009/0152506 A1 | 6/2009 | Umeda et al. |
| 2009/0152541 A1 | 6/2009 | Maekawa et al. |
| 2009/0174012 A1 | 7/2009 | Iwasaki |
| 2009/0184314 A1* | 7/2009 | Aoki et al. ............ 257/40 |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2010/0044864 A1 | 2/2010 | Maekawa et al. |
| 2010/0051940 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0084262 A1 | 4/2011 | Kondratyuk et al. |
| 2011/0097844 A1 | 4/2011 | Takechi et al. |
| 2011/0101351 A1 | 5/2011 | Yamazaki |
| 2011/0108835 A1* | 5/2011 | Kim et al. ............ 257/43 |
| 2011/0133177 A1 | 6/2011 | Suzawa et al. |
| 2011/0147738 A1 | 6/2011 | Yamazaki et al. |
| 2011/0151618 A1 | 6/2011 | Yamazaki et al. |
| 2011/0156022 A1 | 6/2011 | Yamazaki et al. |
| 2011/0180796 A1 | 7/2011 | Yamazaki et al. |
| 2011/0193080 A1 | 8/2011 | Yamazaki et al. |
| 2011/0212569 A1 | 9/2011 | Yamazaki et al. |
| 2011/0260171 A1 | 10/2011 | Yamazaki |
| 2011/0263082 A1 | 10/2011 | Yamazaki |
| 2011/0263083 A1 | 10/2011 | Yamazaki |
| 2011/0263084 A1 | 10/2011 | Yamazaki |
| 2011/0263085 A1 | 10/2011 | Yamazaki |
| 2011/0263091 A1 | 10/2011 | Yamazaki |
| 2011/0284844 A1 | 11/2011 | Endo et al. |
| 2012/0132905 A1 | 5/2012 | Yamazaki |
| 2012/0138922 A1* | 6/2012 | Yamazaki et al. ............ 257/43 |
| 2012/0175625 A1 | 7/2012 | Yamazaki |
| 2012/0211755 A1 | 8/2012 | Fujimori et al. |
| 2012/0231580 A1 | 9/2012 | Yamazaki et al. |
| 2013/0056763 A1 | 3/2013 | Koyama et al. |
| 2013/0140554 A1 | 6/2013 | Yamazaki et al. |
| 2013/0140557 A1 | 6/2013 | Miyairi et al. |
| 2013/0237012 A1 | 9/2013 | Takechi et al. |
| 2013/0285050 A1 | 10/2013 | Yamazaki et al. |
| 2014/0042437 A1 | 2/2014 | Yamazaki |
| 2014/0091303 A1 | 4/2014 | Yamazaki et al. |
| 2014/0103337 A1 | 4/2014 | Yamazaki et al. |
| 2014/0103338 A1 | 4/2014 | Yamazaki et al. |
| 2014/0103340 A1 | 4/2014 | Yamazaki et al. |
| 2014/0106504 A1 | 4/2014 | Yamazaki et al. |
| 2014/0110706 A1 | 4/2014 | Yamazaki |

(56) References Cited

U.S. PATENT DOCUMENTS

| | | | |
|---|---|---|---|
| 2014/0131700 A1 | 5/2014 | Yamazaki | |
| 2014/0131702 A1 | 5/2014 | Matsubayashi et al. | |
| 2014/0151674 A1 | 6/2014 | Yamazaki et al. | |

FOREIGN PATENT DOCUMENTS

| | | | |
|---|---|---|---|
| JP | 57-105889 | A | 7/1982 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | A | 5/1999 |
| JP | 2000-044236 | A | 2/2000 |
| JP | 2000-150900 | A | 5/2000 |
| JP | 2000-315797 | A | 11/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2006-165528 | A | 6/2006 |
| JP | 2009-206306 | A | 9/2009 |
| JP | 2011-171702 | A | 9/2011 |
| JP | 2011-181801 | A | 9/2011 |
| WO | 2004/114391 | A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

(56) References Cited

OTHER PUBLICATIONS

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(AnO)m (m<4):a Zn4s conductor," Philsophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

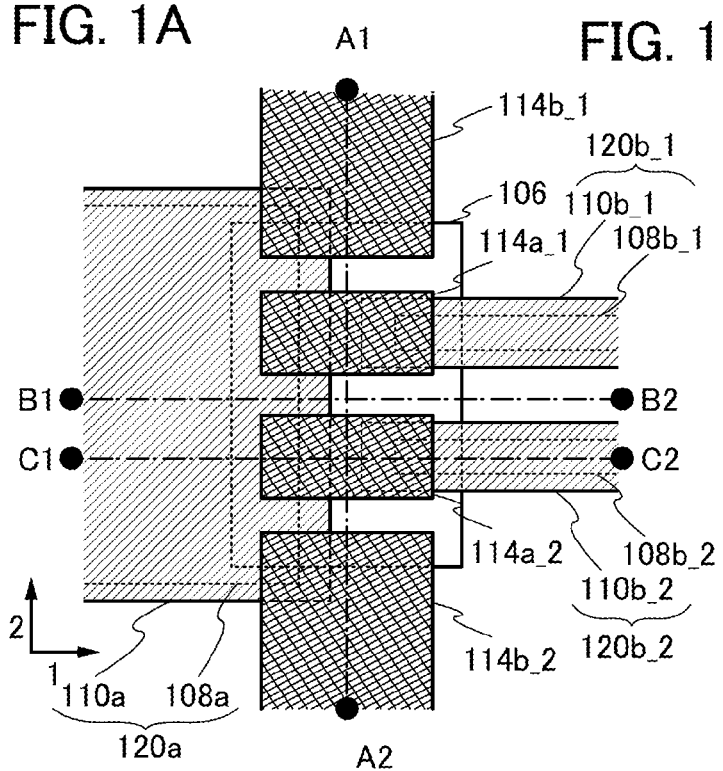
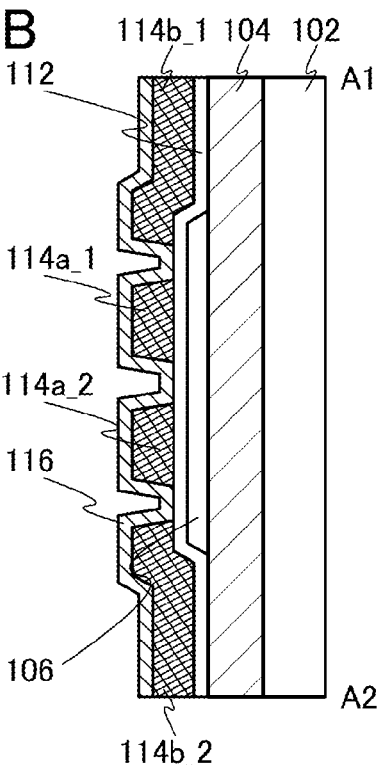
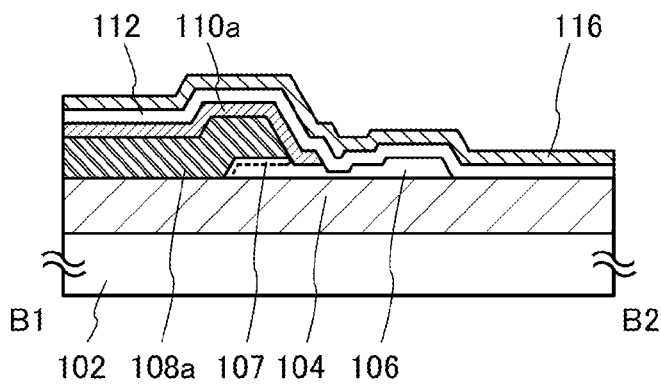
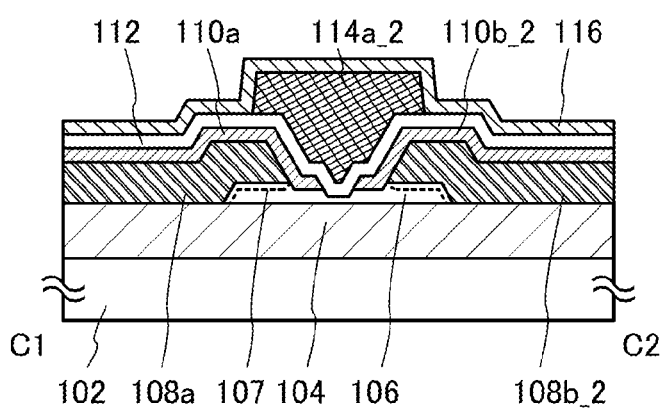

FIG. 4A
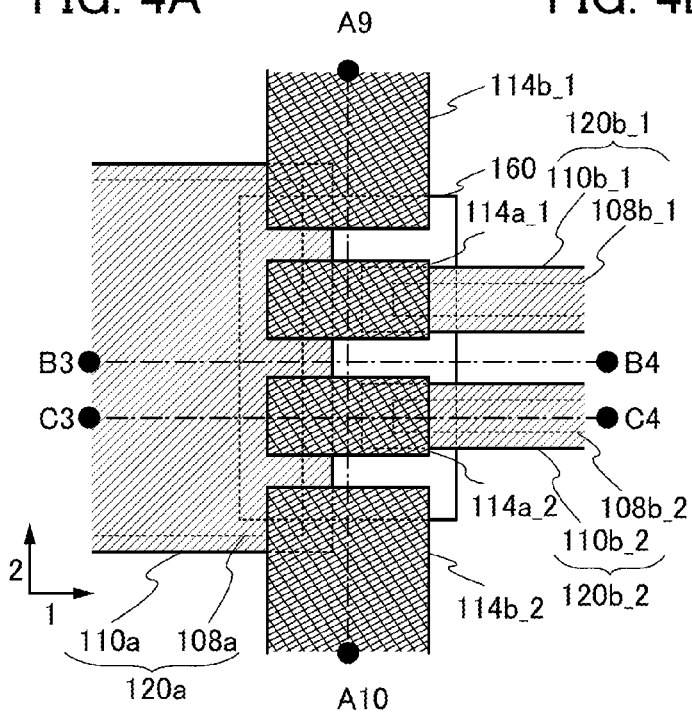
FIG. 4B
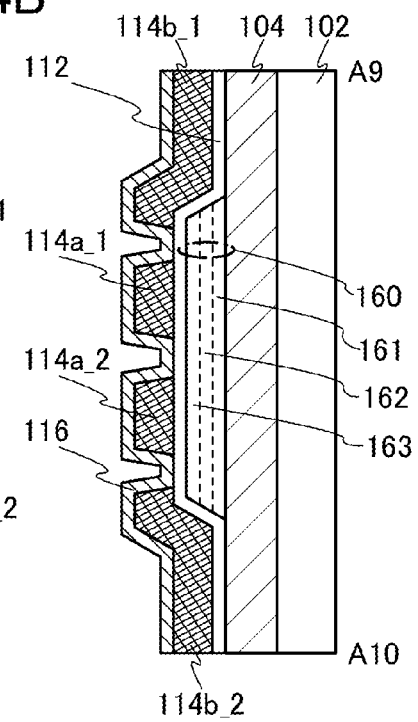
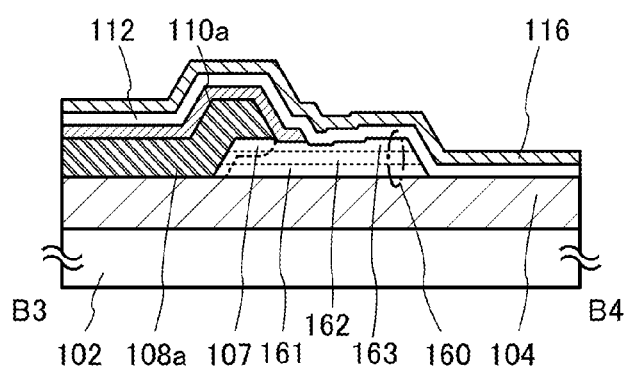
FIG. 4C
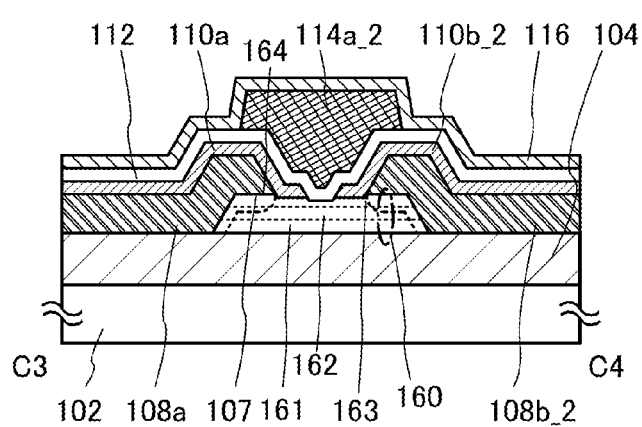
FIG. 4D

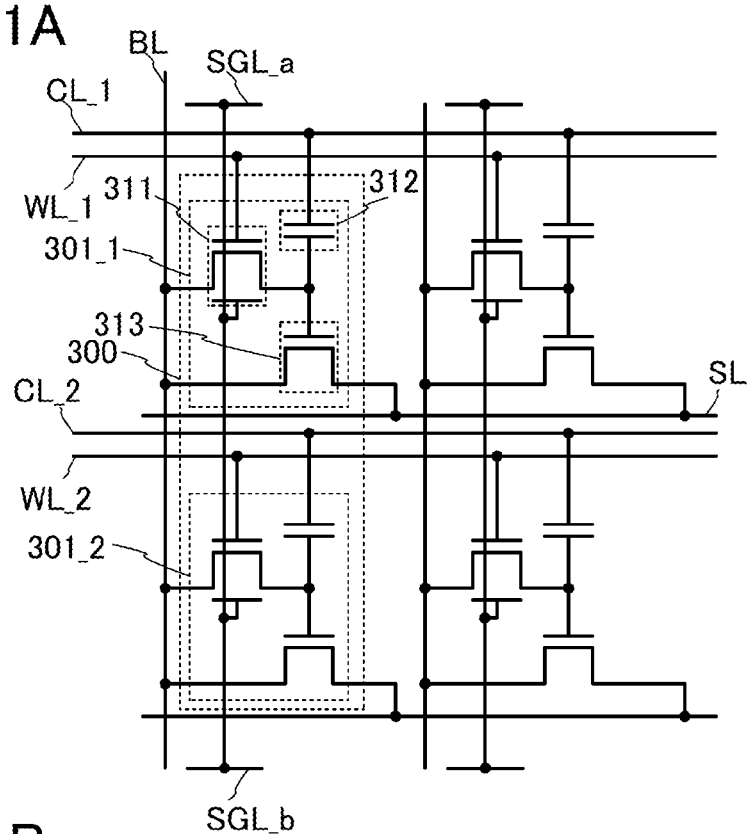
FIG. 11A
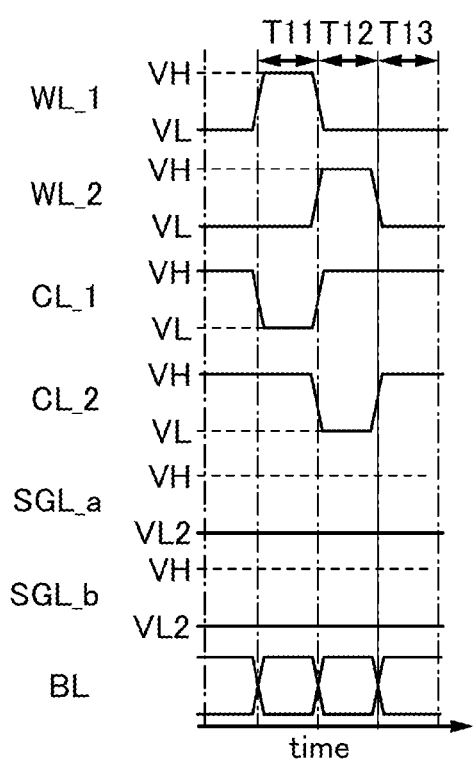
FIG. 11B Writing
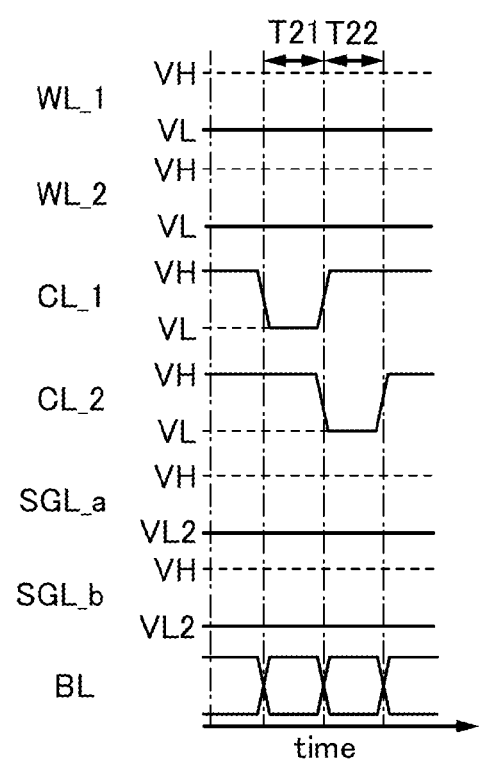
FIG. 11C Reading

SEMICONDUCTOR DEVICE

BACKGROUND OF THE INVENTION

1. Field of the Invention

The present invention relates to semiconductor devices. In particular, the present invention relates to semiconductor devices including oxide semiconductor.

2. Description of the Related Art

In recent years, techniques aiming to lower consumption of semiconductor devices have been developed actively with growing interest in energy resource.

The term "semiconductor device" in this specification indicates all the devices that operate by utilizing semiconductor characteristics. Such a semiconductor device includes transistors and for example, has functional circuits such as memories and processors including transistors.

As the semiconductor device, for example, there is a semiconductor device including a memory provided with a transistor serving as a memory element (also referred to as a memory transistor) (for example, see Patent Document 1).

In a semiconductor device disclosed in Patent Document 1, a memory transistor includes a control gate electrode, a channel formation layer, and a floating gate electrode provided between the control gate electrode and the channel formation layer. By accumulation of electrical charge to be data in the floating gate electrode, data is written to the memory transistor.

The conventional semiconductor device in Patent Document 1 has some problems of data loss due to electric charge leakage, high power consumption, and deterioration of a memory element.

Another example of the semiconductor devices is a semiconductor device including a memory using a selection transistor and an output transistor (for example, Patent Document 2).

In the semiconductor device described in Patent Document 2, the selection transistor is turned on to control electric charge accumulated in a gate of the output transistor, whereby data is written. After that, the selection transistor is turned off so that the electric charge accumulated in the gate of the output transistor is retained, whereby data is held.

REFERENCE

Patent Document 1: Japanese Published Patent Application No. S57-105889
Patent Document 2: Japanese Published Patent Application No. 2011-171702

SUMMARY OF THE INVENTION

In such a semiconductor device described above, leakage current of a transistor, for example, is preferably lowered so as to reduce power consumption. In particular, when a voltage between a gate and a source of the transistor in the semiconductor device is 0 V, power consumption can be drastically reduced if leakage current between the source and a drain, leakage current between the gate and the source, and leakage current between the gate and the drain are lowered.

In addition, a technique is disclosed, in which a transistor formed using an oxide semiconductor is used for a memory circuit, as in the semiconductor device described in Patent Document 2. The transistor formed using an oxide semiconductor has a small amount of leakage current, and thus discharge of electric charge retained can be inhibited.

The transistor using an oxide semiconductor, however, has a problem of being easily normally on, because an impurity such as hydrogen or moisutre or an impurity from an insulating film in contact with the oxide semiconductor enters the oxide semiconductor and forms carriers to cause fluctuation in electric characteristics of the transistor.

In view of the above problem, it is an object of one embodiment of the present invention to give stable electric characteristics to a transistor using an oxide semiconductor in a semiconductor device. In particular, it is another object to reduce leakage current of the transistor. In addition, it is another object to reduce power consumption by reducing leakage current of the transistor.

Note that one embodiment of the present invention can achieve at least one of the above-stated objects.

In accordance with one embodiment of the present invention, an oxide layer including an oxide semiconductor is provided in a region to be a channel of a transistor. The transistor including the oxide semiconductor in its channel formation region can have sufficiently reduced off-state current. In addition, plural gate electrode layers including a gate electrode layer overlapping with a top surface of the oxide semiconductor and a gate electrode layer overlapping with a side surface of the oxide semiconductor are employed, thereby reducing leakage current of the transistor. Details thereof are described below.

One embodiment of the present invention is a semiconductor device including an oxide layer; a source electrode layer in contact with the oxide layer; a first drain electrode layer in contact with the oxide layer; a second drain electrode layer in contact with the oxide layer; a gate insulating film in contact with the oxide layer; a first gate electrode layer overlapping with the source electrode layer and the first drain electrode layer and overlapping with a top surface of the oxide layer, with the gate insulating film interposed therebetween; a second gate electrode layer overlapping with the source electrode layer and the second drain electrode layer and overlapping with the top surface of the oxide layer, with the gate insulating film interposed therebetween; and a third gate electrode layer overlapping with a side surface of the oxide layer with the gate insulating film interposed therebetween.

In accordance with one embodiment of the present invention, leakage current of a transistor can be reduced.

BRIEF DESCRIPTION OF THE DRAWINGS

In the accompanying drawings:

FIG. 1A is a top view illustrating a semiconductor device and FIGS. 1B to 1D are cross-sectional views thereof;

FIG. 4A is a top view illustrating a semiconductor device and FIGS. 4B to 4D are cross-sectional views thereof;

FIGS. 11A to 11C are diagrams illustrating an example of a memory cell;

DETAILED DESCRIPTION OF THE INVENTION

Figure 2A:
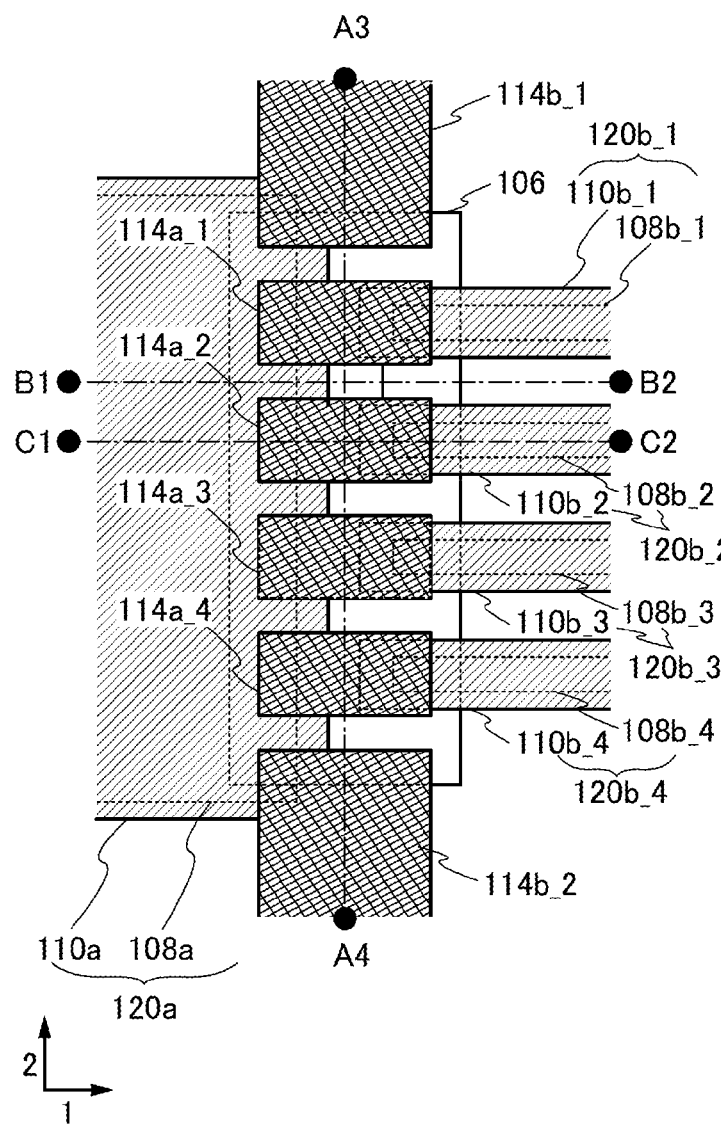
FIG. 2A is a top view illustrating a semiconductor device and FIG. 2B is a cross-sectional view thereof.

Embodiments of the present invention will be described below. Note that it will be readily appreciated by those skilled in the art that details of the embodiments can be modified in various ways without departing from the spirit and scope of the present invention. Thus, the present invention should not be limited to, for example, the description of the following embodiments.

Note that the contents in different embodiments can be combined with one another as appropriate. In addition, the contents of the embodiments can be replaced with each other as appropriate.

Further, the ordinal numbers such as "first" and "second" are used to avoid confusion between components and do not limit the number of each component.

In this specification, a term "parallel" indicates that the angle formed between two straight lines is from −10° to 10°, and accordingly, also includes a case where the angle is from −5° to 5°. In addition, a term "perpendicular" indicates that the angle formed between two straight lines is from 80° to 100°, and accordingly includes a case where the angle is from 85° to 95°.

In addition, in this specification, crystals in trigonal and rhombohedral crystal systems are in the category of crystals in hexagonal crystal system.

Embodiment 1

In this embodiment, an example of a semiconductor device of one embodiment of the present invention will be described with reference to FIGS. 1A to 1D, FIGS. 2A and 2B, and FIGS. 3A to 3D.

Next, a structure example of the semiconductor device in this embodiment is illustrated in FIGS. 1A to 1D. FIG. 1A is a top view of a semiconductor device, and FIGS. 1B to 1D are cross-sectional views taken along the dashed-dotted lines A1-A2, B1-B2, and C1-C2, respectively in FIG. 1A. Note that in the top view of FIG. 1A, some components are seen transparently or omitted for easy understanding.

The semiconductor device illustrated in FIGS. 1A to 1D includes an insulating film 104 formed over a substrate 102; an oxide layer 106 formed over the insulating film 104; a source electrode layer 120a formed over the oxide layer 106; a drain electrode layer 120b_1 and a drain electrode layer 120b_2 formed over the oxide layer 106; a gate insulating film 112 formed over the oxide layer 106, the source electrode layer 120a, the drain electrode layer 120b_1, and the drain electrode layer 120b_2; a gate electrode layer 114a_1 and a gate electrode layer 114a_2 formed over the gate insulating film 112 and overlapping with a top surface of the oxide layer 106 with the gate insulating film 112 interposed therebetween; a gate electrode layer 114b_1 and a gate electrode layer 114b_2 overlapping with a side surface of the oxide layer 106 with the gate insulating film 112 interposed therebetween. In addition, a protective insulating film 116 may be placed over the gate insulating film 112 and the gate electrode layer 114a_2. Further, another insulating layer, a wiring, or the like may be formed over the protective insulating film 116. At this time, in the semiconductor device illustrated in FIG. 1A, each of a region including the gate electrode layer 114a_1, the source electrode layer 120a, and the drain electrode layer 120b_1 and a region including the gate electrode layer 114a_2, the source electrode layer 120a, and the drain electrode layer 120b_2 may, but not limited to, be regarded as one transistor.

In addition, the source electrode layer 120a includes a source electrode layer 108a and a source electrode layer 110a, and the drain electrode layer 120b includes a drain electrode layer 108b and a drain electrode layer 110b. For example, the drain electrode layer 120b_1 includes a drain electrode layer 108b_1 and a drain electrode layer 110b_1, and the drain electrode layer 120b_2 includes a drain electrode layer 108b_2 and a drain electrode layer 110b_2.

In this manner, when the source electrode layer 120a and the drain electrode layer 120b have stacked-layer structures, a transistor having a short channel length (also referred to as L length) can be fabricated. For example, when the source electrode layer 108a and the drain electrode layer 108b are formed using a conductive material being easily bonded to oxygen and are in contact with the oxide layer 106, a phenomenon occurs, in which oxygen included in the oxide layer 106 is diffused or moves into the conductive material being easily bonded to oxygen. The fabrication process of the transistor includes some steps of heat treatment, and thus by the phenomenon, oxygen vacancies are generated in regions of the oxide layer, which are adjacent to and in contact with the source electrode layer and the drain electrode layer, so that the regions become n-type regions. In the semiconductor device in this embodiment, however, the source electrode layer 110a and the drain electrode layer 110b are formed over the source electrode layer 108a and the drain electrode layer 108b respectively, and a conductive material difficult to be bonded to oxygen is used for the source electrode layer 110a and the drain electrode layer 110b, so that a transistor having a short channel length (L length) (e.g., L=30 nm or less) can be fabricated. Note that the channel length (L length) is a distance between the source electrode layer 110a and the drain electrode layer 110b_2 in FIG. 1D.

In addition, the source electrode layer 120a and the drain electrode layer 120b_1 are preferably placed in the direction substantially parallel to a first direction 1 in FIG. 1A. The first direction is the same direction as the channel length direction of the transistor including the gate electrode layer 114a, the source electrode layer 120a, and the drain electrode layer 120b, for example, as illustrated in FIG. 1A.

In addition, the source electrode layer 120a and the drain electrode layer 120b_2 are preferably placed in the direction substantially parallel to the first direction 1. Note that the "substantially parallel" means a parallel state with a margin of −5° to +5°.

The gate electrode layer 114a_1 is overlapped with the source electrode layer 120a and the drain electrode layer 120b_1 with the gate insulating film 112 interposed therebetween, and the gate electrode layer 114a_2 is overlapped with the source electrode layer 120a and the drain electrode layer 120b_2 with the gate insulating film 112 interposed therebetween.

In addition, the gate electrode layer 114a_1 and the gate electrode layer 114a_2 are preferably placed in the direction substantially parallel to a second direction 2 in FIG. 1A. The second direction is the same direction as the channel width direction of the transistor including the gate electrode layer 114a, the source electrode layer 120a, and the drain electrode layer 120b, for example, as illustrated in FIG. 1A. The channel width direction of the transistor is a direction substantially perpendicular to the channel length direction of the transistor, for example, in a two-dimensional plane. Note that the "substantially perpendicular" has a perpendicular state with a margin of −5° to +5°.

As illustrated in FIG. 1A and FIG. 1B, the semiconductor device in this embodiment includes the gate electrode layer 114a_1 and the gate electrode layer 114a_2 overlapping with the top surface of the oxide layer 106, and the gate electrode layer 114b_1 and the gate electrode layer 114b_2 overlapping with the side surface of the oxide layer 106. Although this embodiment describes a structure including the gate electrode layer 114b_1 and the gate electrode layer 114b_2, but not limited thereto and at least one gate electrode layer 114b may be formed in a region overlapping with the side surface of the oxide layer 106. For example, the gate electrode layer 114b_1 alone may be formed. Alternatively, three or more gate electrode layers 114b may be formed.

In addition, the oxide layer 106 includes at least one oxide layer. The at least one oxide layer includes an oxide semiconductor layer at least. The oxide layer 106 in FIGS. 1A to 1D has only one layer and thus an oxide semiconductor layer is used as the oxide layer 106.

The oxide layer 106 includes an oxide semiconductor layer, and the oxide semiconductor layer is made intrinsic or substantially intrinsic, and thereby a transistor having extremely low off-state current can be provided.

In order to make the oxide semiconductor layer intrinsic or substantially intrinsic, the following concentrations in SIMS analysis are preferable: the concentration of silicon in the oxide semiconductor layer is set to be lower than $1 \times 10^{19}$ atoms/cm$^3$, preferably lower than $5 \times 10^{18}$ atoms/cm$^3$, more preferably lower than $3 \times 10^{18}$ atoms/cm$^3$, still more preferably lower than $1 \times 10^{18}$ atoms/cm$^3$; the concentration of hydrogen in the oxide semiconductor layer is set to be $2 \times 10^{20}$ atoms/cm$^3$ or lower, preferably $5 \times 10^{19}$ atoms/cm$^3$ or lower, more preferably $1 \times 10^{19}$ atoms/cm$^3$ or lower, still more preferably $5 \times 10^{18}$ atoms/cm$^3$ or lower; and the concentration of nitrogen in the oxide semiconductor layer is lower than $5 \times 10^{19}$ atoms/cm$^3$, preferably $5 \times 10^{18}$ atoms/cm$^3$ or lower, more preferably $1 \times 10^{18}$ atoms/cm$^3$ or lower, still more preferably $5 \times 10^{17}$ atoms/cm$^3$ or lower.

In addition, in a case where the oxide semiconductor layer includes a crystal, the crystallinity of the oxide semiconductor layer might be decreased if silicon or carbon is included at high concentration. In order not to decrease the crystallinity of the oxide semiconductor layer, the concentration of silicon in the oxide semiconductor layer is set to be lower than $1 \times 10^{19}$ atoms/cm$^3$, preferably lower than $5 \times 10^{18}$ atoms/cm$^3$, more preferably lower than $1 \times 10^{18}$ atoms/cm$^3$, and the concentration of carbon in the oxide semiconductor layer is set to be lower than $1 \times 10^{19}$ atoms/cm$^3$, preferably lower than $5 \times 10^{18}$ atoms/cm$^3$, more preferably lower than $1 \times 10^{18}$ atoms/cm$^3$.

A transistor using the oxide semiconductor layer which is purified as described above for its channel formation region has extremely low off-state current. For example, the drain current when the transistor including a highly purified oxide semiconductor layer is in an off state can be $1 \times 10^{-18}$ A or lower, preferably $1 \times 10^{-21}$ A or lower, more preferably $1 \times 10^{-24}$ A or lower at room temperature (approximately 25° C.), or the drain current can be $1 \times 10^{-15}$ A or lower, preferably $1 \times 10^{-18}$ A or lower, more preferably $1 \times 10^{-21}$ A or lower at 85° C. An off state of a transistor refers to a state where gate voltage is much lower than the threshold voltage in an n-channel transistor. Specifically, the transistor is in an off state when the gate voltage is lower than the threshold voltage by 1V or more, 2V or more, or 3V or more. In FIG. 1D, the channel formation region means a region of the oxide layer 106 including the oxide semiconductor layer, which is overlapped with the gate electrode layer 114a_2. Note that when there is a possibility that n-type regions 107 are formed in the oxide layer 106, a region of the oxide layer 106, which is overlapped with the gate electrode layer 114a_2 and is placed between the n-type regions 107, serves as a channel formation region. In this manner, the channel formation region is formed mainly in the region of the oxide layer 106, which is overlapped with the gate electrode layer 114a_2, and depends on semiconductor characteristics of the oxide layer 106. Accordingly, when the region of the oxide layer 106 overlapping with the gate electrode layer 114a_2 is an i-type region, it serves as the channel formation region, whereas when it is an n-type region, it does not serve as the channel formation region in some cases. Further, a channel refers to a region through which current mainly flows in the channel formation region. For example, in FIG. 1D, the channel refers to a region of the oxide layer 106, which is overlapped with the gate electrode layer 114a_2, is between the second source electrode layer 110a and the second drain electrode layer 110b, and is adjacent to the gate insulating film 112.

Further, the gate electrode layer 114b (the gate electrode layers 114b_1 and 114b_2 in FIGS. 1A to 1D) is formed on the side surface of the oxide layer 106 including an oxide semiconductor described above so as to overlap with each other, so that a potential can be supplied from the side surface of the oxide layer 106. By supplying a potential from the side surface of the oxide layer 106, the threshold voltage of the oxide layer 106 can be controlled. For example, in the case of an n-channel transistor, when a negative potential is supplied from the side surface of the gate electrode layer 114b to the oxide layer 106 including an oxide semiconductor, the threshold voltage of the transistor can be shifted to a positive side. Thus, generation of leakage current in the transistor can be suppressed.

In other words, the gate electrode layer 114b overlapping with the side surface of the oxide layer 106 can serve as a side gate electrode. Note that the thickness of the oxide layer 106 can be larger. When the thickness of the oxide layer 106 is large, the oxide layer 106 can be easily influenced by a potential from the gate electrode layer 114b and the threshold voltage can be easily controlled. The thickness of the oxide layer 106 can be, for example, 15 nm to 1500 nm. By provision of the side gate electrode, the channel formation region of the oxide layer 106 can be fully depleted or substantially fully depleted, and the transistor having such a structure has an effect of extremely low off-state current.

In addition, when the gate electrode layer 114b overlapping with the side surface of the oxide layer 106 is formed and a plurality of gate electrode layers (the gate electrode layer 114a_1 and the gate electrode layer 114a_2 in FIGS. 1A to 1D) are formed in a position overlapping with the top surface of one island-shaped oxide layer 106, a potential is supplied to the gate electrode layer 114b overlapping with the side surface of the oxide layer 106 so as to make a non-conduction state between the source electrode layer 120a and the drain electrode layer 120b_1 and a non-conduction state between the source electrode layer 120a and the drain electrode layer 120b_2 at the same time.

Here, a driving method of the semiconductor device illustrated in FIGS. 1A to 1D is described below. A case where the drain electrode layer 120b_1 and the drain electrode layer 120b_2 are in floating states is described.

In the semiconductor device illustrated in FIGS. 1A to 1D, potentials of the gate electrode layer 114a_1 and the gate electrode layer 114a_2 are independently set so as to make a conduction state between the source electrode layer 120a and the drain electrode layer 120b_1 and a conduction state between the source electrode layer 120a and the drain electrode layer 120b_2, and thereby electric charge is accumulated in the drain electrode layer 120b_1 and the drain electrode layer 120b_2.

For example, the potential of the gate electrode layer 114a_1 is set at a high level to make a conduction state between the source electrode layer 120a and the drain electrode layer 120b_1, so that electric charge is accumulated in the drain electrode layer 120b_1. Further, the potential of the gate electrode layer 114a_1 is set at a low level to make a non-conduction state between the source electrode layer 120a and the drain electrode layer 120b_1, and the potential of the gate electrode layer 114a_2 is set at a high level to make a conduction state between the source electrode layer 120a and the drain electrode layer 120b_2, so that electric charge is accumulated in the drain electrode layer 120b_2.

Further, the potentials of the gate electrode layer 114a_1 and the gate electrode layer 114a_2 are both set at a low level to make a non-conduction state between the source electrode layer 120a and the drain electrode layer 120b_1 and a non-conduction state between the source electrode layer 120a and the drain electrode layer 120b_2. At this time, electric charge accumulated in the drain electrode layer 120b_1 and the drain electrode layer 120b_2 is held.

In addition, the potentials of the gate electrode layer 114b_1 and the gate electrode layer 114b_2 are set to be negative. Here, the example is described, in which the potentials of the gate electrode layer 114b_1 and the gate electrode layer 114b_2 are set to be negative after the potentials of the gate electrode layer 114a_1 and the gate electrode layer 114a_2 are set at a low level, but the order of steps is not limited thereto and a negative potential may be supplied to the gate electrode layer 114b_1 and the gate electrode layer 114b_2 in advance.

In this manner, a common potential is supplied to the oxide layer 106 overlapping with the gate electrode layer 114a_1 and the gate electrode layer 114a_2 from the gate electrode layer 114a_1 and the gate electrode layer 114a_2.

Therefore, when the drain electrode layer 120b_1 and the drain electrode layer 120b_2 are in floating states, the both can hold electric charge or hold electric charge for an extremely long time.

In addition, in the example of the semiconductor device illustrated in FIGS. 1A to 1D, one source electrode layer 120a is used with respect to the gate electrode layer 114a_1 and the gate electrode layer 114a_2. A common source electrode layer is used with respect to a plurality of gate electrode layers, so that the number of wirings controlling the source electrode layer can be reduced. However, without being limited to this example, as many source electrode layer 120a as the gate electrode layers 114a or the drain electrode layers 120b may be provided, for example.

Figure 2B:
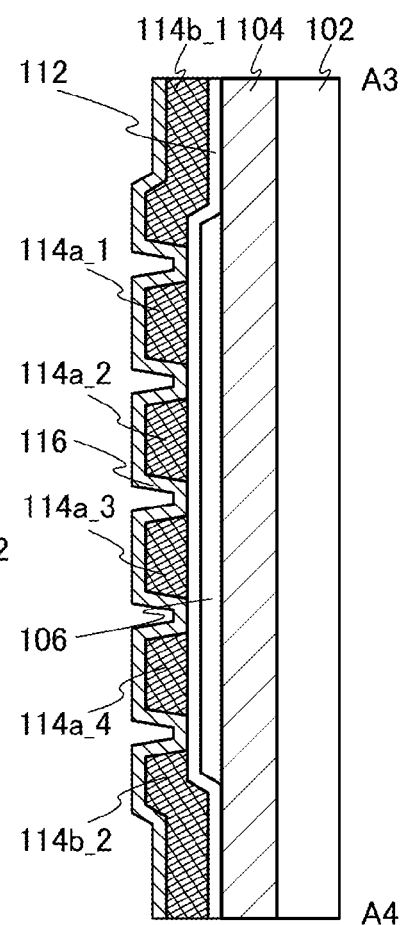

In addition, in the example of the semiconductor device illustrated in FIGS. 1A to 1D, two gate electrode layers 114a and two drain electrode layers 120b are formed in the region overlapping with the oxide layer 106, but without being limited to this example, four gate electrode layers 114a and four drain electrode layers 120b may be formed as illustrated in FIGS. 2A and 2B, for example.

FIG. 2A is a top view of a semiconductor device, and FIG. 2B is a cross-sectional view taken along the dashed-dotted line A3-A4 in FIG. 2A. Note that in the top view of FIG. 2A, some components are seen transparently or omitted for easy understanding. For the portions in FIGS. 2A and 2B which are the same as those in FIGS. 1A to 1D, description of FIGS. 1A to 1D is referred to as appropriate. For example, the cross-sectional views in FIGS. 1C and 1D can be referred to for the cross sections taken along the dashed-dotted lines B1-B2 and C1-C2 in FIG. 2A.

The semiconductor device illustrated in FIGS. 2A and 2B further includes a gate electrode layer 114a_3, a gate electrode layer 114a_4, a drain electrode layer 120b_3 (a drain electrode layer 108b_3 and a drain electrode layer 110b_3), a drain electrode layer 120b_4 (a drain electrode layer 108b_4 and a drain electrode layer 110b_4) in addition to the components illustrated in FIGS. 1A to 1D.

The gate electrode layer 114a_3 overlaps with the source electrode layer 120a and the drain electrode layer 120b_3 with the gate insulating film 112 interposed therebetween. In addition, the gate electrode layer 114a_3 overlaps with a top surface of the oxide layer 106 with the gate insulating film 112 interposed therebetween.

The gate electrode layer 114a_4 overlaps with the source electrode layer 120a and the drain electrode layer 120b_4 with the gate insulating film 112 interposed therebetween. In addition, the gate electrode layer 114a_4 overlaps with the top surface of the oxide layer 106 with the gate insulating film 112 interposed therebetween.

For example, when the semiconductor device of this embodiment is used for a memory element, the number of the gate electrode layers 114a is preferably $2^n$ (n is a natural number), as in the structure of this embodiment in which four gate electrode layers 114a are formed.

Alternatively, one gate electrode layer 114a and one drain electrode layer 120b may be provided, as illustrated in FIGS. 3A to 3D.

Figure 3A:
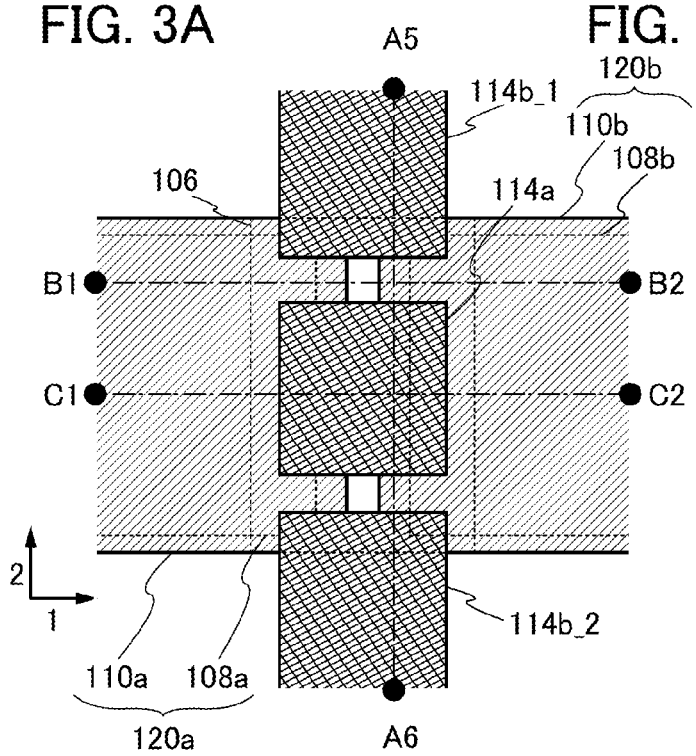
FIGS. 3A and 3C are top views illustrating semiconductor devices and FIGS. 3B and 3D are cross-sectional views thereof.
Figure 3B:
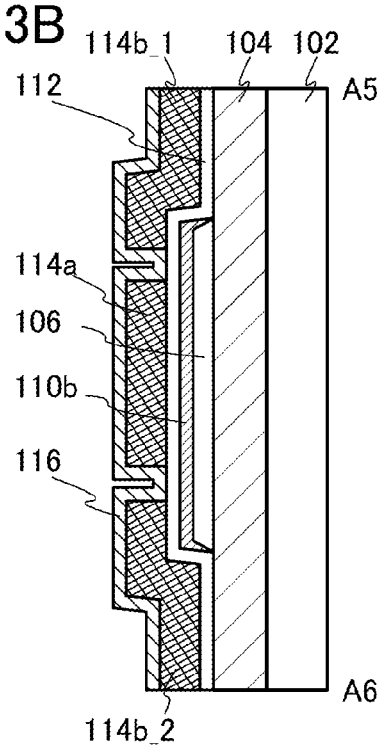
Figure 3C:
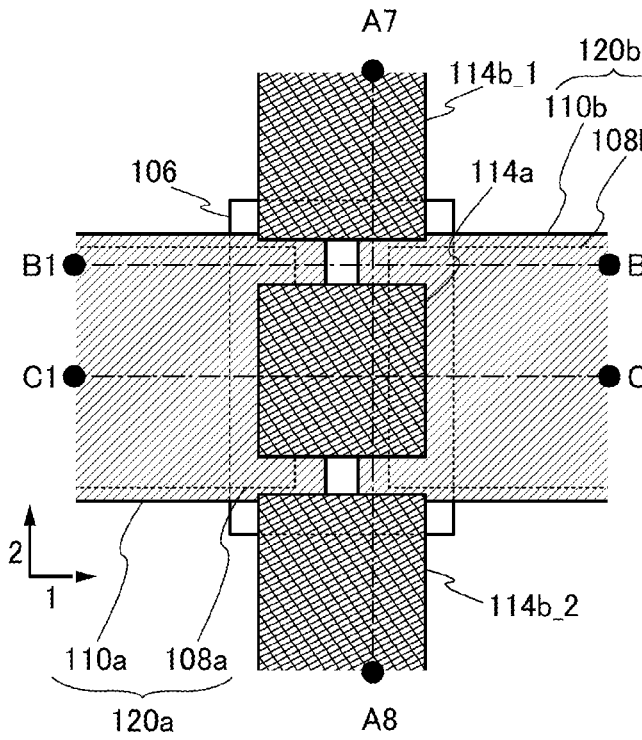
Figure 3D:
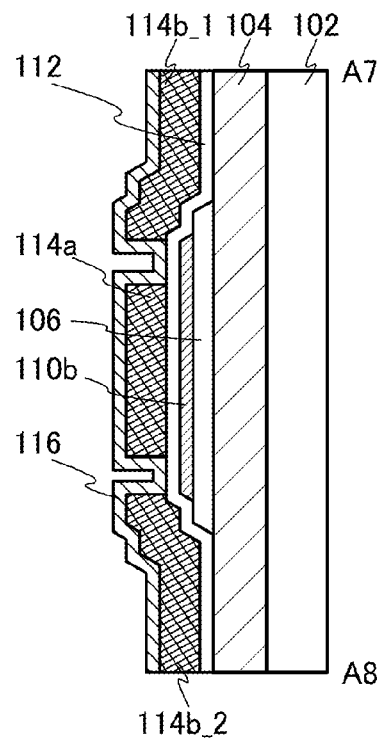

FIGS. 3A and 3C are top views of the semiconductor devices, FIG. 3B is a cross-sectional view taken along the dashed-dotted line A5-A6 in FIG. 3A, and FIG. 3D is a cross-sectional view taken along the dashed-dotted line A7-A8 in FIG. 3C. In the top views of FIGS. 3A and 3C, some components are seen transparently or omitted for easy understanding. For the portions in FIGS. 3A to 3D which are the same as those in FIGS. 1A to 1D or FIGS. 2A and 2B, description of FIGS. 1A to 1D or FIGS. 2A and 2B is referred to as appropriate. For example, the cross-sectional views in FIGS. 1C and 1D can be referred to for the cross sections taken along the dashed-dotted lines B1-B2 and C1-C2 in FIGS. 3A and 3C.

The semiconductor device illustrated in FIGS. 3A to 3D includes the gate electrode layer 114a instead of the gate electrode layer 114a_1 and the gate electrode layer 114a_2 in FIGS. 1A to 1D, and the drain electrode layer 120b (the drain electrode layer 108b and the drain electrode layer 110b) instead of the drain electrode layer 120b_1 and the drain electrode layer 120b_2 in FIGS. 1A to 1D.

The gate electrode layer 114a overlaps with the source electrode layer 120a and the drain electrode layer 120b with the gate insulating film 112 interposed therebetween. In addition, the gate electrode layer 114a overlaps with the top surface of the oxide layer 106 with the gate insulating film 112 interposed therebetween.

In addition, in the semiconductor device illustrated in FIGS. 3A and 3B, the source electrode layer 120a (specifically the source electrode layer 110a) and the drain electrode layer 120b (specifically the drain electrode layer 110b) are formed at substantially the same position as the position of the side surface in the second direction of the oxide layer 106.

On the other hand, in the semiconductor device illustrated in FIGS. 3C and 3D, the source electrode layer 120a (specifically the source electrode layer 110a) and the drain electrode layer 120b (specifically the drain electrode layer 110b) are formed on the inner side than the side surface in the second direction of the oxide layer 106.

The position where the source electrode layer 120a and the drain electrode layer 120b are formed with respect to the oxide layer 106 has an influence on potential supply to the oxide layer 106 from the gate electrode layer 114b_1 and the gate electrode layer 114b_2.

For example, because in the structure illustrated in FIGS. 1A to 1D, the source electrode layer 120a is placed below the gate electrode layer 114b_1 and the gate electrode layer 114b_2, an electric field might be blocked with the source electrode layer 120a when a potential is supplied to the gate electrode layer 114b_1 and the gate electrode layer 114b_2. In the structures in FIGS. 3A and 3B or FIGS. 3C and 3D, in contrast, blocking of an electric field with the source electrode layer 120a or the drain electrode layer 120b can be reduced, which is preferred.

As in the above-described example, the semiconductor device can include the oxide layer 106, the source electrode layer 120a in contact with the oxide layer 106, a K-th (K is an integer from 1 to n (n is a natural number of 2 or more) drain electrode layer 120b in contact with the oxide layer 106, the gate insulating film 112 in contact with the oxide layer 106, a K-th gate electrode layer 114a overlapping with the top surface of the oxide layer 106 with the gate insulating film 112 interposed therebetween, a gate electrode layer 114b overlapping with the side surface of the oxide layer 106 with the gate insulating film 112 interposed therebetween, and the K-th gate electrode layer 114a overlaps with the source electrode layer 120a and the K-th drain electrode layer 120b with the gate insulating film 112 interposed therebetween.

Note that the structures in which the gate electrode layer 114a is formed over the oxide layer 106 have been described with reference to FIGS. 1A to 1D, FIGS. 2A and 2B, and FIGS. 3A to 3D, but do not limit the present invention and the oxide layer 106 may be formed over the gate electrode layer 114a.

Details of the elements included in the semiconductor devices illustrated in FIGS. 1A to 1D, FIGS. 2A and 2B, and FIGS. 3A to 3D are described below.

The substrate 102 may be a substrate over which another element such as a transistor is formed. In that case, at least one of the gate electrode layer 114a, the gate electrode layer 114b, the source electrode layer 120a, and the drain electrode layer 120b may be electrically connected to the another element described above.

The insulating film 104 has a function of preventing diffusion of an impurity from the substrate 102, and further a function of supplying oxygen to the oxide layer 106. The insulating film 104 is preferably an insulating film containing excess oxygen. The insulating film containing excess oxygen means an oxide insulating film that can release oxygen by heat treatment or the like. Preferably, the amount of oxygen released from the insulating film, which is converted into oxygen atoms in thermal desorption spectroscopy, is preferably $1.0 \times 10^{19}$ atoms/cm$^3$ or higher. In addition, the "excess oxygen" means oxygen movable among the insulating film 104, the oxide layer 106, and the gate insulating film 112, oxygen which exists in excess of the stoichiometric composition, or oxygen having a function of filling or occupying Vo (oxygen vacancies) resulting from lack of oxygen. The oxygen released from the insulating film 104 can be diffused into the channel formation region of the oxide layer 106, and thus oxygen vacancies that might be formed in the oxide layer can be filled with oxygen. Accordingly, stable electric characteristics of the transistor can be provided.

The oxide layer 106 can, for example, be an In-based metal oxide, a Zn-based metal oxide, an In—Zn-based metal oxide, an In—Ga—Zn-based metal oxide, or the like.

Alternatively, a metal oxide including another metal element instead of part or all of Ga in the In—Ga—Zn-based metal oxide may be used. As such a metal element, for example, a metal element that is capable of being bonded with more oxygen atoms than gallium is can be used, and one or more elements of zirconium, germanium, and tin can be used, for instance. Alternatively, as the metal element, one or more elements of lanthanum, cerium, praseodymium, neodymium, samarium, europium, gadolinium, terbium, dysprosium, holmium, erbium, thulium, ytterbium, and lutetium may be used. These metal elements function as stabilizers. Note that the amount of such a metal element added is determined so that the metal oxide can function as semiconductor. When a metal element is used, which is capable of being bonded with more oxygen atoms than gallium is and oxygen is supplied to the metal oxide, oxygen defects in the metal oxide can be reduced.

For example, the oxide layer 106 may include c-axis aligned crystalline oxide semiconductor (hereinafter, referred to as CAAC-OS).

A film of CAAC-OS (hereinafter, referred to as CAAC-OS film) is one of oxide semiconductor films including multiple crystal parts, and most of the crystal parts each fit inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of a microcrystalline oxide semiconductor film. The CAAC-OS film is described in detail below.

In observation with a transmission electron microscope (TEM) image of the CAAC-OS film, a boundary between crystal parts, that is, a grain boundary is not clearly seen. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, the surface is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when a CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (ϕ scan) is performed under conditions where the sample is rotated around a normal vector of a sample surface as an axis (ϕ axis) with 2θ fixed at around 56°. In the sample formed of a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when ϕ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, when a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, when crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film may vary depending on regions.

Note that when the CAAC-OS film having an InGaZnO$_4$ crystal is analyzed by an out-of-plane method, a peak of 2θ may also be observed at around 36° as well as at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

With the use of the CAAC-OS film in a transistor, change in electric characteristics of the transistor due to irradiation with visible light or ultraviolet light is small. Thus, the transistor has high reliability.

Preferred conditions for the deposition of the CAAC-OS are described below.

For example, the CAAC-OS is formed while the impurity concentration is reduced, whereby the crystal state of the oxide semiconductor can be prevented from being broken by impurities. For example, impurities (e.g., hydrogen, water, carbon dioxide, and nitrogen) existing in a deposition chamber of a sputtering apparatus are preferably reduced. Further, the concentration of impurities in a deposition gas is preferably reduced. For example, a deposition gas whose dew point is −80° C. or lower, preferably −120° C. or lower is preferably used as a deposition gas.

Preferably, a substrate heating temperature at the time of deposition is high. At a high substrate heating temperature, when a flat-plate-like sputtered particle reaches the substrate, migration of the sputtered particle occurs, so that a flat plane of the sputtered particle is attached to the substrate. For example, an oxide semiconductor film is deposited at a substrate heating temperature from 100° C. to 600° C., preferably from 200° C. to 500° C., further preferably from 150° C. to 450° C., whereby a CAAC-OS film can be deposited.

Further, it is preferable to suppress plasma damage at the time of deposition by increasing the oxygen percentage in the deposition gas and optimizing electric power. For example, the oxygen percentage in the deposition gas is preferably 30 vol % or higher, still preferably 100 vol %.

When an In—Ga—Zn—O compound target is used as a sputtering target, an In—Ga—Zn—O compound target in which InO$_x$ powder, GaO$_y$ powder, and ZnO$_z$ powder are mixed in the molar ratio of 2:2:1, 8:4:3, 3:1:1, 1:1:1, 4:2:3, or 3:1:2 is preferably used, for example. Note that x, y, and z are each a given positive number.

When the oxide film is formed by a sputtering method, heat treatment is performed on the oxide film in addition to the substrate heating during the film formation, so that the impurity concentration in the oxide film can be reduced.

Specifically, the concentration of hydrogen in the oxide film, which is measured by secondary ion mass spectrometry (SIMS), can be set to be $2 \times 10^{20}$ atoms/cm$^3$ or lower, preferably $5 \times 10^{19}$ atoms/cm$^3$ or lower, further preferably $1 \times 10^{19}$ atoms/cm$^3$ or lower, still further preferably $5 \times 10^{18}$ atoms/cm$^3$ or lower.

The concentration of nitrogen in the oxide film, which is measured by SIMS, can be set to be lower than $5 \times 10^{19}$ atoms/cm$^3$, preferably $5 \times 10^{18}$ atoms/cm$^3$ or lower, further preferably $1 \times 10^{18}$ atoms/cm$^3$ or lower, still further preferably $5 \times 10^{17}$ atoms/cm$^3$ or lower.

The concentration of carbon in the oxide film, which is measured by SIMS, can be set to be lower than $5 \times 10^{19}$ atoms/cm$^3$, preferably $5 \times 10^{18}$ atoms/cm$^3$ or lower, further preferably $1 \times 10^{18}$ atoms/cm$^3$ or lower, still further preferably $5 \times 10^{17}$ atoms/cm$^3$ or lower.

The concentration of silicon in the oxide film, which is measured by SIMS, can be set to be lower than $5 \times 10^{19}$ atoms/cm$^3$, preferably $5 \times 10^{18}$ atoms/cm$^3$ or lower, further preferably $1 \times 10^{18}$ atoms/cm$^3$ or lower, still further preferably $5 \times 10^{17}$ atoms/cm$^3$ or lower.

The amount of each of the following gas molecules (atoms) released from the oxide film can be $1 \times 10^{19}$/cm$^3$ or less, preferably $1 \times 10^{18}$/cm$^3$ or less or less, which is measured by thermal desorption spectroscopy (TDS) analysis: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

For the source electrode layer 108a, the drain electrode layer 108b_1, the drain electrode layer 108b_2, the drain electrode layer 108b_3, and the drain electrode layer 108b_4, conductive materials easily bonded to oxygen can be used. For example, Al, Cr, Cu, Ta, Ti, Mo, W, or the like can be used. W (tungsten) having a high melting point is especially preferred because a relatively high process temperature can be employed in a later step. Note that the category of the conductive materials easily bonded to oxygen includes materials in which oxygen is easily diffused or transferred.

When the conductive material easily bonded to oxygen is in contact with the oxide layer, there is a phenomenon in which oxygen included in the oxide layer is diffused or transferred into the conductive material easily bonded to oxygen. A fabrication process of a transistor includes some steps of heat treatment, and by the phenomenon, oxygen vacancies are generated in regions of the oxide layer, which are adjacent to and in contact with the source electrode layer and the drain electrode layer, so that the regions become n-type regions. Accordingly, the n-type regions can serve as a source or a drain region of the transistor.

In FIGS. 1C and 1D, the n-type region in the oxide layer 106 is illustrated as the n-type region 107 by a broken line.

When a transistor having an extremely short channel length is fabricated, the n-type region due to generation of oxygen vacancies might extend in the channel length direction of the transistor. In that case, a state (conduction state) such as a shift of the threshold voltage or uncontrollable on-off state by a gate voltage emerges in electric characteristics of the transistor. For that reason, in a case where a transistor having an extremely short channel length is fabricated, it is not preferable to use such a conductive material easily bonded to oxygen for a source electrode and a drain electrode.

Therefore, as in this embodiment, the source electrode layer and the drain electrode layer have a stacked-layer structure and a conductive material difficult to be bonded to oxygen is employed for the source electrode layer 110a and the drain electrode layer 110b on which the channel length depends. Preferred examples of the conductive materials include conductive nitrides such as tantalum nitride and titanium nitride, ruthenium, and the like. Note that the category of the conductive materials difficult to be bonded to oxygen includes conductive materials in which oxygen is difficult to be diffused or transferred.

Since the conductive material difficult to be bonded to oxygen is used for the source electrode layer 110a and the drain electrode layer 110b, it is possible to inhibit generation of oxygen vacancies in the channel formation region formed in the oxide layer 106 and formation of an n-type channel. Thus, even the transistor having an extremely short channel length can have superior electric characteristics.

If the source electrode layer and the drain electrode layer are formed using only the conductive material difficult to be bonded to oxygen, the contact resistance with the oxide layer 106 becomes too high; therefore, preferably, the source electrode layer 108a and the drain electrode layer 108b are formed over the oxide layer 106, and the source electrode layer 110a and the drain electrode layer 110b are formed to cover the source electrode layer 108a and the drain electrode layer 108b.

The gate insulating film 112 can be an insulating film including one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. In addition, the gate insulating film 112 may be a stacked-layer including any of the above materials.

For the gate electrode layers 114a and 114b, a conductive film of Al, Ti, Cr, Co, Ni, Cu, Y, Zr, Mo, Ru, Ag, Ta, W, or the like can be used. In addition, the gate electrode layers 114a and 114b may be stacked-layers including any of the above materials.

For the protective insulating film 116, a material in which oxygen is hardly diffused or transferred may be used. In addition, a film containing less hydrogen can be used for the protective insulating film 116. The hydrogen content in the protective insulating film 116 is preferably less than $5 \times 10^{19}$/cm$^3$, further preferably less than $5 \times 10^{18}$/cm$^3$. When the protective insulating film 116 satisfies the above hydrogen content, the off-state current of the transistor can be reduced. For example, a silicon nitride film or a silicon nitride oxide film can be used for the protective insulating film 116.

That is an example of the structure of the semiconductor device in this embodiment.

In the semiconductor device in this embodiment, the threshold voltage of the oxide layer can be controlled by provision of the gate electrode layer overlapping with the side surface of the oxide layer including an oxide semiconductor and supply of a potential from the side surface of the oxide layer. In other words, the gate electrode layer overlapping with the side surface of the oxide layer can serve as a side gate electrode. By provision of the side gate electrode, the channel formation region in the oxide layer 106 can be fully depleted, so that off-state current of the transistor can be reduced.

One embodiment of the present invention can be combined with any of the embodiments as appropriate.

Embodiment 2

In this embodiment, an example of a semiconductor device of one embodiment of the present invention will be described with reference to FIGS. 4A to 4D, FIG. 5, FIGS. 6A and 6B, FIGS. 7A and 7B, and FIG. 8, which is a different mode from that of the semiconductor device in Embodiment 1.

The semiconductor device illustrated in FIGS. 4A to 4D is a modification example of the semiconductor device illustrated in FIGS. 1A to 1D in Embodiment 1, and thus portions having functions similar to the components in FIGS. 1A to 1D are hatched in the same manner and the detailed description thereof is omitted. The semiconductor device illustrated in FIGS. 4A to 4D includes an oxide stack 160 instead of the oxide layer 106 in the semiconductor device illustrated in FIGS. 1A to 1D.

FIG. 4A is a top view of the semiconductor device, and FIGS. 4B, 4C, and 4D are cross-sectional views taken along the dashed-dotted lines A9-A10, B3-B4, and C3-C4 respectively in FIG. 4A. Note that in the top view of FIG. 4A, some components are seen transparently or omitted for easy understanding.

The semiconductor device illustrated in FIGS. 4A to 4D includes the insulating film 104 formed over the substrate 102; the oxide stack 160 (surrounded by the dashed-dotted line) formed over the insulating film 104; the source electrode layer 108a and the drain electrode layer 108b_2 that are in contact with part of a top surface and a side surface of the oxide stack 160; the second source electrode layer 110a and the second drain electrode layer 110b_2 that are formed over the source electrode layer 108a and the drain electrode layer 108b2, respectively, and are in contact with part of the top surface of the oxide stack 160; the gate insulating film 112 that is formed over the second source electrode layer 110a and the second drain electrode layer 110b_2, and is in contact with the top surface of the oxide stack 160 between the second source electrode layer 110a and the second drain electrode layer 110b_2; and the gate electrode layer 114a_2 overlapping with the oxide stack 160 with the gate insulating film 112 interposed therebetween. In addition, the protective insulating film 116 may be placed over the gate insulating film 112 and the gate electrode layer 114a_2. Further, another insulating layer, a wiring, or the like may be formed over the protective insulating film 116.

The gate electrode layer 114a_1 overlaps with the source electrode layer 120a and the drain electrode layer 120b_1 with the gate insulating film 112 interposed therebetween.

The gate electrode layer 114a_2 overlaps with the source electrode layer 120a and the drain electrode layer 120b_2 with the gate insulating film 112 interposed therebetween.

In addition, as illustrated in FIGS. 4A and 4B, the semiconductor device in this embodiment includes the gate electrode layer 114a_1 and the gate electrode layer 114a_2 overlapping with the top surface of the oxide stack 160, and the gate electrode layer 114b_1 and the gate electrode layer 114b_2 each overlapping with the side surface of the oxide stack 160. With the gate electrode layer 114b (the gate electrode layers 114b_1 and 114b_2 in FIGS. 4A and 4B) overlapping with the side surfaces of the oxide stack 160, a potential can be supplied from the side surfaces of the oxide stack 160. The threshold voltage of the oxide stack 160 can be controlled by supply of a potential from the side surfaces of the oxide stack 160. For example, when the oxide stack 160 is used for an n-channel transistor, the threshold voltage of the transistor can be shifted to the positive side by supply of a negative potential from the side surfaces of the oxide stack 160. Thus, leakage current in the transistor can be reduced.

The oxide stack 160 includes at least an oxide semiconductor layer 162 forming a channel, a first oxide layer 161 provided between the oxide semiconductor layer 162 and the insulating film 104, and a second oxide layer 163 provided between the oxide semiconductor layer 162 and the gate insulating film 112. The oxide semiconductor layer 162 is provided between the first oxide layer 161 and the second oxide layer 163. Note that the n-type regions 107 are illustrated by the bolder broken line than the other lines.

The first oxide layer 161 and the second oxide layer 163 are each an oxide layer including at least one of metal elements constituting the oxide semiconductor layer 162.

For description of the oxide semiconductor layer 162, description of the oxide layer 106 in Embodiment 1 can be referred to.

In this manner, in the oxide stack 160, by formation of the oxide layers in which fewer oxygen vacancies are generated than in the oxide semiconductor layer 162 in contact with the top surface and the bottom surface of the oxide semiconductor layer 162 forming a channel, generation of oxygen vacancies can be inhibited in a channel of a transistor. Note that in FIG. 4D, the channel formation region means a region of the oxide stack 160 (the first oxide layer 161, the oxide semiconductor layer 162, and the second oxide layer 163) that overlaps with the gate electrode layer 114a_2. Note that when the n-type region 107 can be formed in the oxide stack 160, a region of the oxide stack 160 that overlaps with the gate electrode layer 114a_2 and is interposed between the n-type regions 107 serves as a channel formation region. The channel formation region is mainly formed in a region of the oxide stack 160 overlapping with the gate electrode layer 114a_2 and depends on semiconductor characteristics of the oxide stack 160. Accordingly, the region of the oxide stack 160 overlapping with the gate electrode layer 114a_2 serves as a channel formation region when the oxide stack 160 has an i-type and does not serve as a channel formation region when the oxide stack 160 has an n-type. Further, a channel mainly refers to a region of current flow in the channel formation region. For example, in FIG. 4D, the channel is a region of the oxide stack 160 that overlaps with the gate electrode layer 114a_2, is placed between the second source electrode layer 110a and the second drain electrode layer 110b_2, and in oxide semiconductor layer 162.

The concept of the oxide stack 160 illustrated in FIGS. 4A to 4D are further described with reference to FIG. 5, FIGS. 6A and 6B, and FIGS. 7A and 7B.

Figure 5:
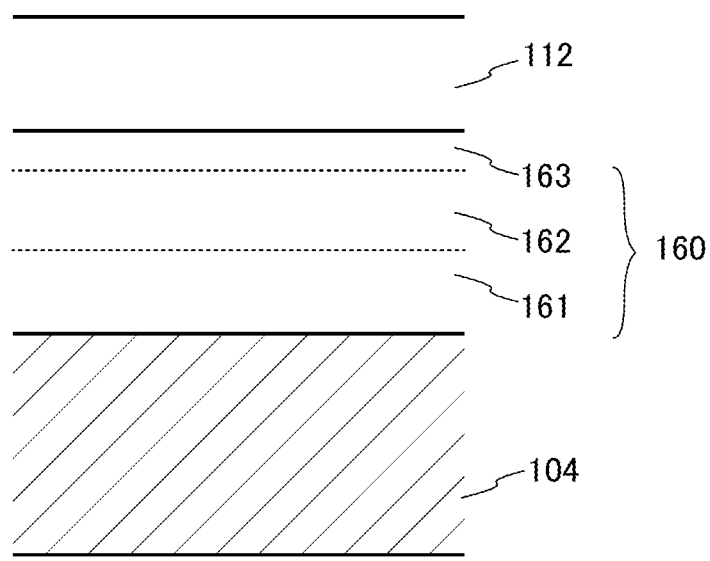
FIG. 5 is a cross-sectional view illustrating an oxide stack in accordance with one embodiment of the present invention.

A stacked-layer structure illustrated in FIG. 5 includes the oxide stack 160 between the insulating film 104 and the gate insulating film 112. In addition, the oxide stack 160 includes the first oxide layer 161, the oxide semiconductor layer 162, and the second oxide layer 163.

The first oxide layer 161 and the second oxide layer 163 are each an oxide layer including at least one of metal elements constituting the oxide semiconductor layer 162.

The oxide semiconductor layer 162 includes at least a layer including indium, zinc and M (M is a metal of Al, Ga, Ge, Y, Zr, Sn, La, Ce, Hf, or the like), which is referred to as an In-M-Zn oxide layer. The oxide semiconductor layer 162 preferably includes indium, because carrier mobility of the transistor is increased.

The first oxide layer 161 as a layer that is placed below the oxide semiconductor layer 162 is represented by an In-M-Zn oxide (M is a metal of Al, Ti, Ga, Ge, Y, Zr, Sn, La, Ce, Hf, or the like), and includes an oxide layer having an atomic ratio of M higher than that of the oxide semiconductor layer 162. Specifically, the amount in an atomic ratio of any of the above elements in the first oxide layer 161 is one and a half times or more, preferably twice or more, more preferably three times or more as much as that in the oxide semiconductor layer 162. Any of the above elements is more strongly bonded to oxygen than indium is and thus has a function of inhibiting generation of oxygen vacancies in the oxide layer. That is, the first oxide layer 161 is an oxide layer in which oxygen vacancies are more unlikely to be generated than in the oxide semiconductor layer 162.

In addition, like the first oxide layer 161, the second oxide layer 163 as a layer that is placed above the oxide semiconductor layer 162 is represented by an In-M-Zn oxide layer (M is a metal of Al, Ti, Ga, Ge, Y, Zr, Sn, La, Ce, Hf, or the like), and includes an oxide layer having an atomic ratio of M higher than that of the oxide semiconductor layer 162. Specifically, the amount in an atomic ratio of any of the above elements included in the second oxide layer 163 is one and a half times or more, preferably twice or more, further preferably three times or more as much as that in the oxide semiconductor layer 162.

In other words, when each of the first oxide layer 161, the oxide semiconductor layer 162, and the second oxide layer 163 is an In-M-Zn oxide layer containing at least indium, zinc, and M (M is a metal element such as Al, Ti, Ga, Ge, Y, Zr, Sn, La, Ce, or Hf), and the atomic ratio of In to M and Zn included in the first oxide layer 161 is $x_1:y_1:z_1$, the atomic ratio of In to M and Zn included in the oxide semiconductor layer 162 is $x_2:y_2:z_2$, and the atomic ratio of In to M and Zn included in the second oxide layer 163 is $x_3:y_3:z_3$, each of $y_1/x_1$ and $y_3/x_3$ is preferably larger than $y_2/x_2$. Each of $y_1/x_1$ and $y_3/x_3$ is one and a half times or more as large as $y_2/x_2$, preferably twice or more as large as $y_2/x_2$, more preferably three times or more as large as $y_2/x_2$. At this time, when $y_2$ is greater than or equal to $x_2$ in the oxide semiconductor layer 162, a transistor can have stable electrical characteristics. However, when $y_2$ is three times or more as large as $x_2$, the field-effect mobility of the transistor is reduced; accordingly, $y_2$ is preferably smaller than three times $x_2$.

Note that when the first oxide layer 161 is an In-M-Zn oxide layer, preferably in the atomic ratio of In and M, the proportion of In is lower than 50 atomic % and the proportion of M is 50 atomic % or higher, and further preferably in the atomic ratio of In and M, the proportion of In is lower than 25 atomic % and the proportion of M is 75 atomic % or higher.

When the oxide semiconductor layer 162 is an In-M-Zn oxide layer, preferably in the atomic ratio of In and M, the proportion of In is 25 atomic % or higher and the proportion of M is lower than 75 atomic %, and preferably in the atomic ratio of In and M, the proportion of In is 34 atomic % or higher and the proportion of M is lower than 66 atomic %. When the second oxide layer 163 is an In-M-Zn oxide layer, preferably in the atomic ratio of In and M, the proportion of In is lower than 50 atomic % and the proportion of M is 50 atomic % or higher, and further preferably in the atomic ratio of In and M, the concentration of In is lower than 25 atomic % and the proportion of M is 75 atomic % or higher.

The constituent elements of the first oxide layer 161 may be different from those of the second oxide layer 163, or their constituent elements may be the same at the same atomic ratios or different atomic ratios.

For each of the first oxide layer 161, the oxide semiconductor layer 162, and the second oxide layer 163, for example, an oxide semiconductor containing indium, zinc, and gallium can be used. Typically, the first oxide layer 161 can be formed using an In—Ga—Zn oxide containing In, Ga, and Zn at an atomic ratio of 1:3:2, an In—Ga—Zn oxide containing In, Ga, and Zn at an atomic ratio of 1:6:4, an In—Ga—Zn oxide containing In, Ga, and Zn at an atomic ratio of 1:9:6, or an oxide containing In, Ga, and Zn in the vicinity of the above atomic ratios. The oxide semiconductor layer 162 can be formed using an In—Ga—Zn oxide containing In, Ga, and Zn at an atomic ratio of 1:1:1, an In—Ga—Zn oxide containing In, Ga, and Zn at an atomic ratio of 3:1:2, or an oxide containing In, Ga, and Zn in the vicinity of the above atomic ratios. The second oxide layer 163 is preferably formed using an In—Ga—Zn oxide containing In, Ga, and Zn at an atomic ratio of 1:3:2, an In—Ga—Zn oxide containing In, Ga, and Zn at an atomic ratio of 1:6:4, an In—Ga—Zn oxide containing In, Ga, and Zn at an atomic ratio of 1:9:6, or an oxide containing In, Ga, and Zn in the vicinity of the above atomic ratios.

The thickness of the first oxide layer 161 is from 3 nm to 100 nm, preferably from 3 nm to 50 nm. The thickness of the oxide semiconductor layer 162 is from 3 nm to 1500 nm, preferably from 3 nm to 100 nm, further preferably from 3 nm 50 nm.

Preferably, each of the first oxide layer 161 and the second oxide layer 163 contains one or more kinds of metal elements forming the oxide semiconductor layer 162, and is formed using an oxide semiconductor whose energy of the bottom of the conduction band is higher than that of the oxide semiconductor layer 162 by 0.05 eV or more, 0.07 eV or more, 0.1 eV or more, or 0.15 eV or more and which is close to the vacuum level by 2 eV or less, 1 eV or less, 0.5 eV or less, or 0.4 eV or less.

When an electric field is applied to the gate electrode layer 114a_2 in such a structure, a channel is formed in the oxide semiconductor layer 162 of the oxide stack 160, because the oxide semiconductor layer 162 has low energy at the bottom of the conduction band. In other words, the second oxide layer 163 is formed between the oxide semiconductor layer 162 and the gate insulating film 112, and thereby a structure in which the channel of the transistor is not in contact with the gate insulating film 112 can be obtained.

A band structure of the oxide stack 160 is described here. A stack corresponding to the oxide stack 160 is fabricated, and in the stack, an In—Ga—Zn oxide having an energy gap of 3.15 eV is used as a layer corresponding to each of the first oxide layer 161 and the second oxide layer 163 and an In—Ga—Zn oxide having an energy gap of 2.8 eV is used as a layer corresponding to the oxide semiconductor layer 162.

The band structure thereof is analyzed. Note that for convenience, the stack is referred to as an oxide stack, and the layers forming the stack are referred to as a first oxide layer, an oxide semiconductor layer, and a second oxide layer.

The thickness of each of the first oxide layer, the oxide semiconductor layer, and the second oxide layer is 10 nm. The energy gap is measured with use of a spectroscopic ellipsometer (UT-300 manufactured by HORIBA Jobin Yvon). Further, the energy gap in the vicinity of an interface between the first oxide layer and the oxide semiconductor layer is 3 eV, and the energy gap in the vicinity of an interface between the second oxide layer and the oxide semiconductor layer is 3 eV.

Figure 6A:
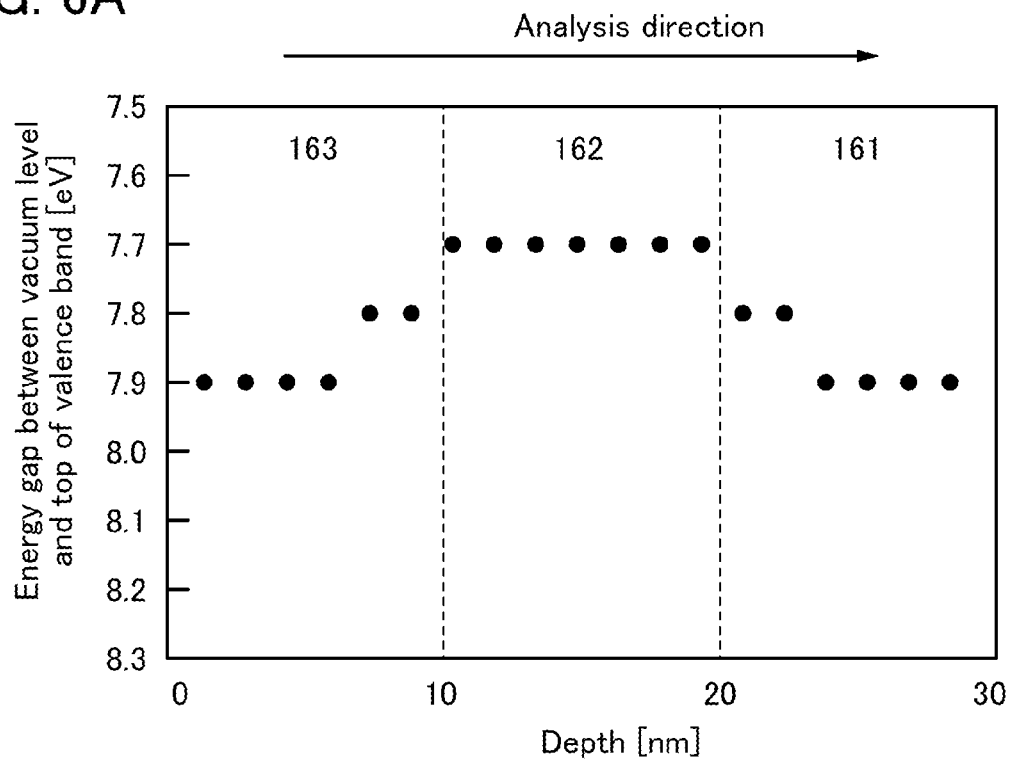
FIGS. 6A and 6B each illustrate a band structure of the oxide stack in accordance with one embodiment of the present invention.

FIG. 6A is a graph showing plotted values which each are an energy gap between the vacuum level and the top of valence band of the layers measured while the oxide stack is etched from the second oxide layer side. The energy gap between the vacuum level and the top of the valence band is measured using an ultraviolet photoelectron spectroscopy (UPS) device (VersaProbe manufactured by ULVAC-PHI, Inc.).

Figure 6B:
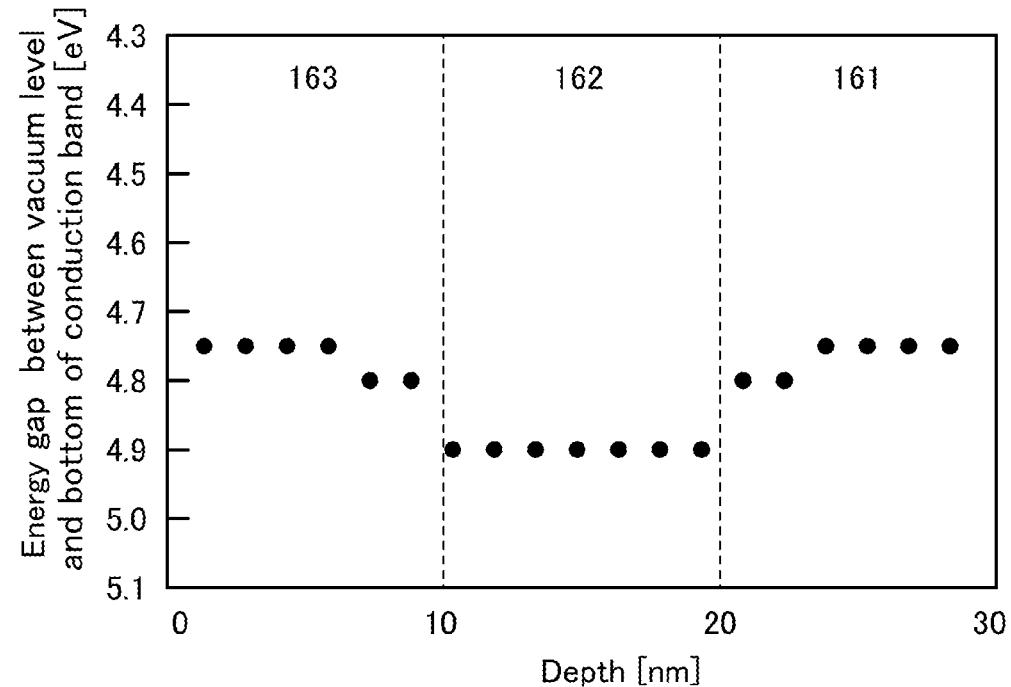

FIG. 6B is a graph showing plotted values which each are an energy gap (electron affinity) between the vacuum level and the bottom of the conduction band, which is calculated by subtracting the energy gap of each layer from the energy gap between the vacuum level and the top of the valence band.

Figure 7A:
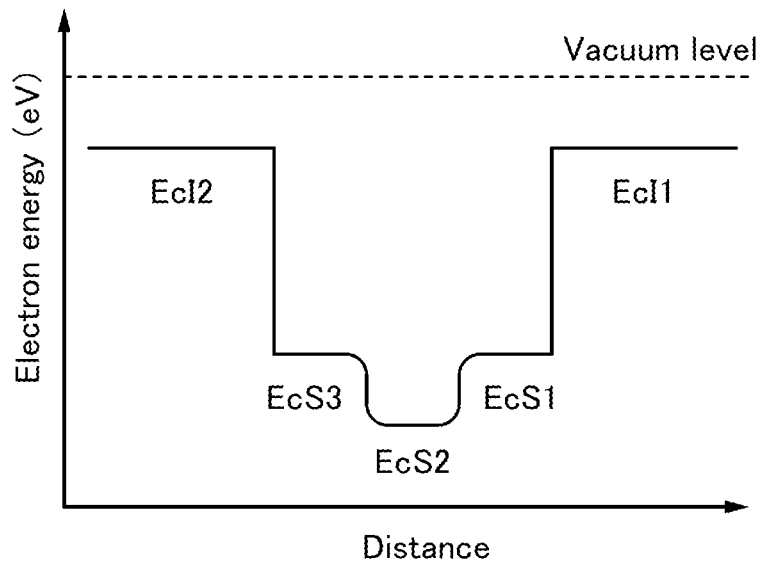
FIGS. 7A and 7B each illustrate a band structure of an oxide stack in accordance with one embodiment of the present invention.

Part of the band structure in FIG. 6B is schematically illustrated in FIG. 7A. FIG. 7A shows a case where silicon oxide films are provided in contact with the first oxide layer and the second oxide layer. In FIG. 7A, the vertical axis represents electron energy (eV) and the horizontal axis represents distance. In addition, EcI1 and EcI2 represent energy at the bottoms of the conduction bands of the silicon oxide films, EcS1 represents energy at the bottom of the conduction band of the first oxide layer, EcS2 represents energy at the bottom of the conduction band of the oxide semiconductor layer, and EcS3 represents energy at the bottom of the conduction band of the second oxide layer.

As shown in FIG. 7A, the energies of the bottoms of the conduction bands of the first oxide layer, the oxide semiconductor layer, and the second oxide layer are changed continuously. This can be understood also based on the fact that the compositions of the first oxide layer, the oxide semiconductor layer, and the second oxide layer are close to each other and oxygen is easily diffused.

Figure 7B:
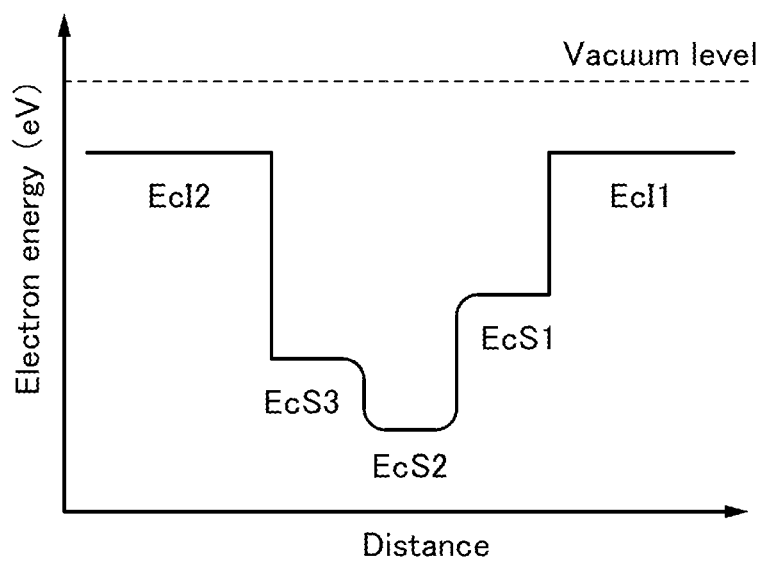

Although the first oxide layer and the second oxide layer are oxide layers having the same energy gap in the case shown in FIG. 7A, the first oxide layer and the second oxide layer may be oxide layers having different energy gaps. For example, part of the band structure when EcS1 is higher than EcS3 is shown in FIG. 7B. Alternatively, although not shown in FIGS. 7A and 7B, EcS3 may be higher than EcS1.

According to FIGS. 6A and 6B and FIGS. 7A and 7B, the oxide semiconductor layer of the oxide stack serves as a well and a channel of the transistor including the oxide stack is formed in the oxide semiconductor layer. Note that since the energies of the bottoms of the conduction bands are changed continuously, the oxide stack can also be said to have a U-shaped well. Further, a channel formed to have such a structure can also be referred to as a buried channel.

Since each of the first oxide layer 161 and the second oxide layer 163 is an oxide layer containing one or more kinds of metal elements forming the oxide semiconductor layer 162, the oxide stack 160 can also be referred to as an oxide stack in which layers containing the same main components are stacked. The oxide stack in which layers containing the same main components are stacked is not a simply stacked layer but formed to have continuous junction (here, particularly a U-shaped well structure where energy at the bottom of each conduction band is continuously changed between the layers. This is because when a defect level or an impurity for an oxide semiconductor, for example, a defect level such as a trapping center or a recombination center, or an impurity forming a barrier which inhibits the flow of carriers is mixed at an interface between the layers, the continuity of the energy band is lost, and thus carriers are trapped or disappear by recombination at the interface.

In order to form a continuous junction, the layers should be stacked successively without exposure to air with the use of a multi-chamber deposition apparatus (a sputtering apparatus) including a load lock chamber. Each chamber in the sputtering apparatus is preferably subjected to high vacuum evacuation (to a vacuum of about $1 \times 10^{-4}$ Pa to $5 \times 10^{-7}$ Pa) with use of a suction vacuum evacuation pump such as a cryopump in order to remove water or the like, which is an impurity for an oxide semiconductor, as much as possible. Alternatively, a turbo-molecular pump is preferably used in combination with a cold trap so that a gas does not flow backward from an evacuation system to a chamber.

In order to obtain a highly purified intrinsic oxide semiconductor, a chamber should be subjected to high vacuum evacuation, and in addition, a sputtering gas should be highly purified. When a highly purified gas having a dew point of $-40°$ C. or lower, preferably $-80°$ C. or lower, further preferably $-100°$ C. or lower is used as an oxygen gas or an argon gas used as a sputtering gas, moisture or the like can be prevented from entering an oxide semiconductor as much as possible.

The first oxide layer 161 and the second oxide layer 163 which are provided above and below the oxide semiconductor layer 162 each serve as a barrier layer, and can prevent a trap level formed at an interface between the oxide stack 160 and each of the insulating layers which are in contact with the oxide stack 160 (the insulating film 104 and the gate insulating layer 112) from adversely affecting the oxide semiconductor layer 162 which serves as a main carrier path in the transistor.

For example, oxygen vacancies contained in the oxide semiconductor layer appear as localized states in deep energy area in the energy gap of the oxide semiconductor. A carrier is trapped in such localized states, so that reliability of the transistor is lowered. For this reason, oxygen vacancies contained in the oxide semiconductor layer should be reduced. The oxide layers in which oxygen vacancies are less likely to be generated than in the oxide semiconductor layer 162 are provided over and under and in contact with the oxide semiconductor layer 162 in the oxide stack 160, whereby oxygen vacancies in the oxide semiconductor layer 162 can be reduced. For example, in the oxide semiconductor layer 162, the absorption coefficient due to the localized levels, which is obtained by measurement by a constant photocurrent method (CPM) is set lower than $1 \times 10^{-3}$/cm, preferably lower than $1 \times 10^{-4}$/cm.

In addition, when the oxide semiconductor layer 162 is in contact with an insulating layer including a different constituent element (e.g., a base insulating layer including a silicon oxide film), an interface state is sometimes formed at the interface of the two layers and the interface state forms a channel. At this time, a second transistor having a different threshold voltage appears, so that an apparent threshold voltage of the transistor is varied. However, since the first oxide layer 161 contains one or more kinds of metal elements forming the oxide semiconductor layer 162 in the oxide stack 160, an interface state is less likely to be formed at an interface between the first oxide layer 161 and the oxide semiconductor layer 162. Thus, the formation of the first oxide layer 161 makes it possible to reduce fluctuation in the electrical characteristics of the transistor, such as threshold voltage.

When a channel is formed at an interface between the gate insulating film 112 and the oxide semiconductor layer 162, interface scattering occurs at the interface and the field-effect mobility of the transistor is decreased. However, since the second oxide layer 163 contains one or more kinds of metal elements forming the oxide semiconductor layer 162 in the oxide stack 160, scattering of carriers is less likely to occur at an interface between the second oxide layer 163 and the oxide semiconductor layer 162, and thus the field-effect mobility of the transistor can be increased.

Further, the first oxide layer 161 and the second oxide layer 163 each also serve as a barrier layer which inhibits formation of an impurity level due to the entry of the constituent elements of the insulating layers (the insulating layer 104 and the gate insulating film 112) which are in contact with the oxide stack 160 into the oxide semiconductor layer 162.

For example, when a silicon-containing insulating layer is used for the insulating film 104 or the gate insulating film 112 which is in contact with the oxide stack 160, silicon in the insulating layer or carbon that might be mixed into the insulating layer can enter the first oxide layer 161 or the second oxide layer 163 at a depth of several nanometers from the interface. An impurity such as silicon, carbon, or the like entering the oxide semiconductor layer forms an impurity state. The impurity state serves as a donor and generates an electron, so that the oxide semiconductor layer may become n-type.

However, when the thicknesses of the first oxide layer 161 and the second oxide layer 163 are larger than several nanometers, the mixed impurity such as silicon or carbon does not reach the oxide semiconductor layer 162, so that the influence of an impurity state is reduced.

Here, the concentration of silicon contained in the oxide semiconductor layer is set to be $3 \times 10^{18}$/cm$^3$ or lower, preferably $3 \times 10^{17}$/cm$^3$ or lower. In addition, the concentration of carbon in the oxide semiconductor layer is set to be $3 \times 10^{18}$/cm$^3$ or lower, preferably $3 \times 10^{17}$/cm$^3$ or lower. In particular, the oxide semiconductor layer 162 serving as a carrier path is preferably sandwiched or surrounded by the first oxide layer 161 and the second oxide layer 163 in order to prevent entrance of much silicon or carbon, which is a Group 14 element, to the oxide semiconductor layer 162. That is, the concentrations of silicon and carbon contained in the oxide semiconductor layer 162 are preferably lower than those in the first oxide layer 161 and the second oxide layer 163.

Note that the impurity concentrations of the oxide semiconductor layer can be measured by secondary ion mass spectrometry (SIMS).

If hydrogen or moisture is contained in the oxide semiconductor layer as an impurity, it can work as a donor and form an n-type region; therefore, in order to achieve a well-shaped structure, it is useful to provide a protective insulating layer (a nitride silicon layer, or the like) for preventing entrance of hydrogen or moisture from the outside, to the upper portion of the oxide stack 160.

Figure 8:
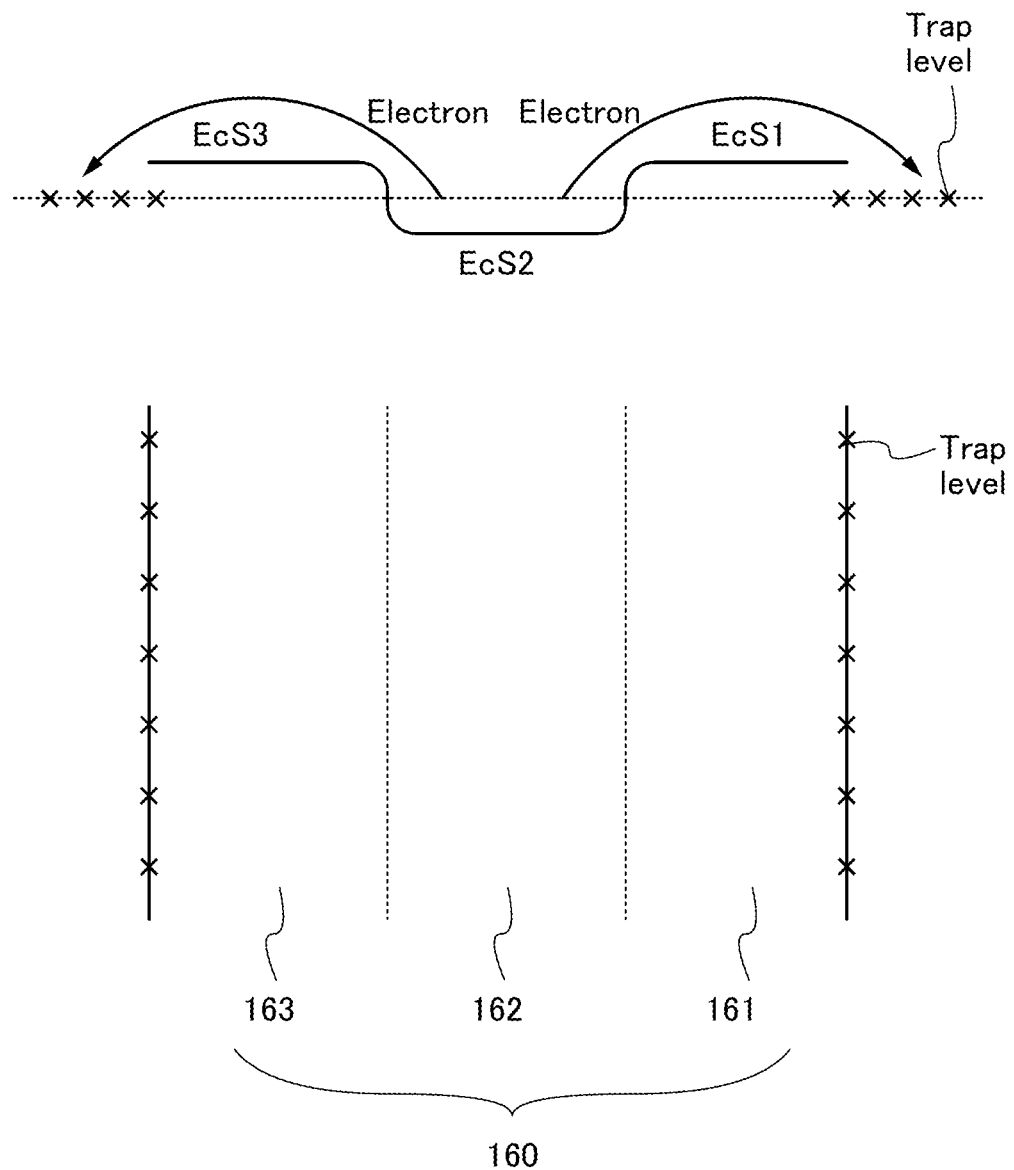
FIG. 8 illustrates a band structure of an oxide stack in accordance with one embodiment of the present invention.

As illustrated in FIG. 8, trap levels derived from an impurity or a defect can be formed in the vicinity of the interfaces between the first and the second oxide layers and insulating films such as the silicon oxide films. The first and the second oxide layers enable the oxide semiconductor layer and the trap states to be distanced from each other. However, if an energy gap between EcS1 or EcS3 and EcS2 is small, an electron in the oxide semiconductor layer might reach the trap state by exceeding the first oxide layer or the second oxide layer. When the electron is captured by the trap state, it become negative fixed electric charge, so that the threshold voltage of the transistor is shifted to the positive side.

Thus, the energy gap between EcS1 and EcS2 and the energy gap between EcS3 and EcS2 are each preferably 0.1 eV or larger, further preferably 0.15 eV or larger, because the variation amount of the threshold voltage of the transistor is reduced and the transistor can have stable electrical characteristics.

Each of the oxide layers included in the multilayer structure of the oxide stack contains at least indium (In) and is deposited using a sputtering target with which a film can be formed by a sputtering method, preferably a DC sputtering method. By containing indium, the sputtering target can have increased conductivity. With the use of such a sputtering target, deposition by a DC sputtering method is performed more easily.

As a material forming the first oxide layer 161 and the second oxide layer 163, a material which is represented by an In-M-Zn oxide (M is a metal element such as Al, Ti, Ga, Ge, Y, Zr, Sn, La, Ce, or Hf) is used. As M, Ga is preferably used. However, a material with a high proportion of Ga, specifically the material represented as $InGa_XZn_YO_Z$ with X exceeding 10, is not suitable because powder may be generated in the deposition and deposition by a sputtering method may become difficult.

Note that for each of the first oxide layer 161 and the second oxide layer 163, a material in which the proportion of indium in the atomic ratio is smaller than a material used for the oxide semiconductor layer 162 is used. The indium and gallium contents in the oxide layers can be compared by time-of-flight secondary ion mass spectrometry (also referred to as TOF-SIMS) or X-ray photoelectron spectrometry (also referred to as XPS).

When the first oxide layer 161 contains a constituent element (e.g., silicon) of the insulating film 104 as an impurity, it may have an amorphous structure. Note that the oxide semiconductor layer 162 in which a channel is formed preferably has a crystal part. When the oxide semiconductor layer 162 having a crystal part is stacked over the first oxide layer 161 having an amorphous structure, the oxide stack can be referred to as a hetero structure having different crystal structures.

In addition, the second oxide layer 163 can have an amorphous structure or a crystal part. Formation of the second oxide layer 163 over the oxide semiconductor layer 162 having a crystal part allows the second oxide layer 163 to easily have a crystal structure. In that case, a boundary between the oxide semiconductor layer 162 and the second oxide layer 163 cannot be clearly identified by observation of the cross section with a transmission electron microscope (TEM) in some cases. Note that the second oxide layer 163 has lower crystallinity than that of the oxide semiconductor layer 162. Hence, it can be said that the boundary can be determined based on the degree of crystallinity.

At least the oxide semiconductor layer 162 in the oxide stack 160 is preferably a CAAC-OS layer. For the details of the CAAC-OS, the description in Embodiment 1 can be referred to.

As described in this embodiment, an oxide is provided to be in contact with an oxide semiconductor to form an oxide stack including the oxide semiconductor and the oxide, whereby it is possible to prevent an impurity such as hydrogen or moisture or an impurity contained in an insulating film in contact with the oxide stack from entering the oxide semiconductor layer and forming a carrier.

In addition, with such a structure of the oxide stack, interface scattering hardly occurs at the interface between the oxide and the oxide semiconductor. Thus, the transistor can have a high field-effect mobility because the movement of carriers is not hindered at the interface. In addition, by formation of the oxide in contact with the oxide semiconductor, intrusion of an impurity into the oxide semiconductor layer can be inhibited, and thus the transistor using the oxide semiconductor can have stable electric characteristics.

The methods and structures described in this embodiment can be combined as appropriate with any of the methods and structures described in the other embodiments.

Embodiment 3

In this embodiment, an example of a semiconductor device of one embodiment of the present invention will be described with reference to FIGS. 9A to 9D and FIGS. 10A to 10C, which is a different mode from those of the semiconductor devices in Embodiment 1 and Embodiment 2.

Figure 9A:
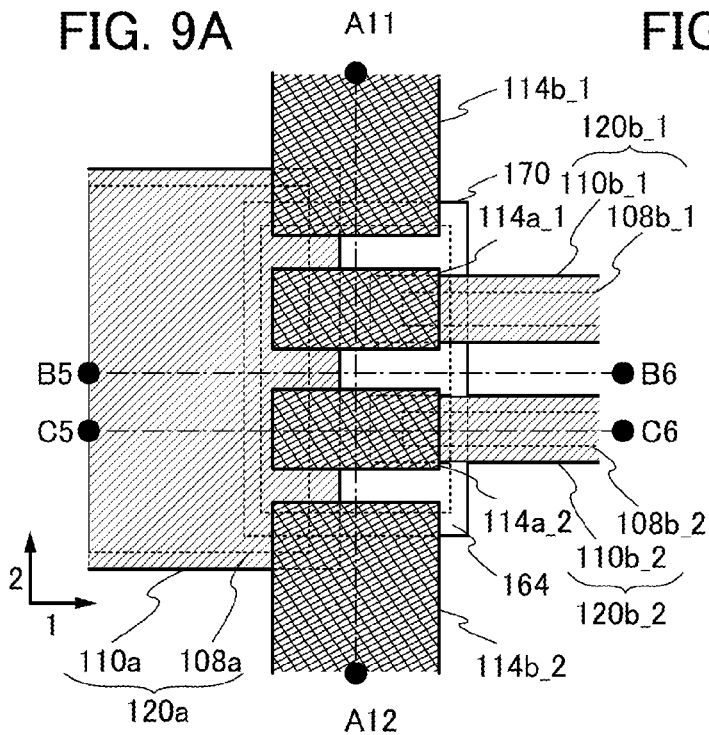
FIG. 9A is a top view illustrating a semiconductor device and FIGS. 9B to 9D are cross-sectional views thereof.
Figure 9B:
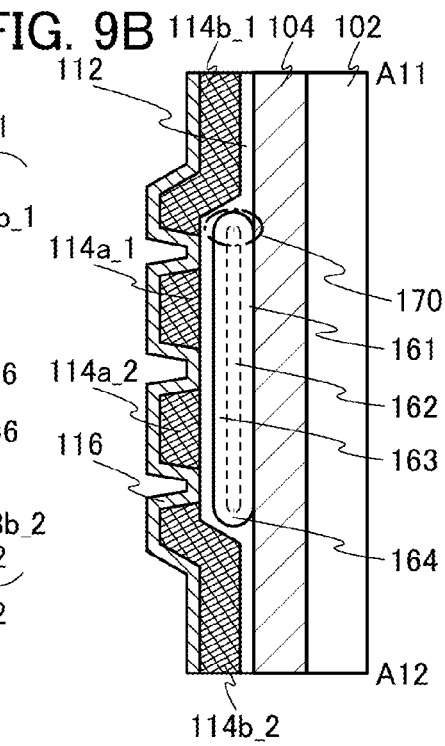
Figure 9C:
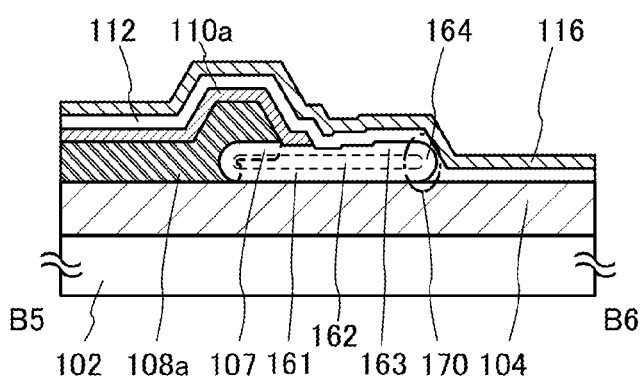
Figure 9D:
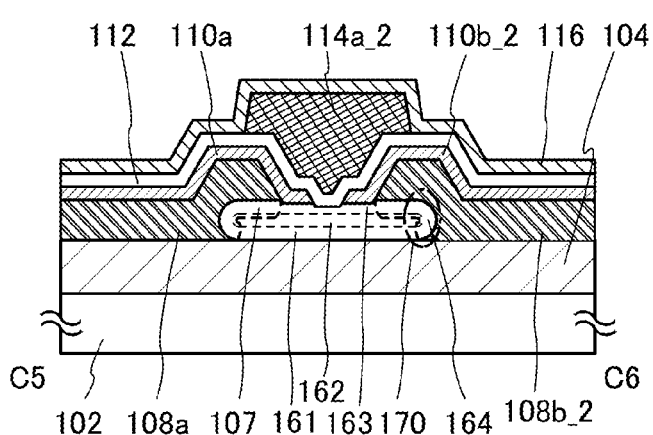

FIG. 9A is a top view of the semiconductor device, and FIGS. 9B to 9D are cross-sectional views taken along the dashed-dotted lines A11-A12, B5-B6, and C5-C6 in FIG. 9A. Note that in the top view of FIG. 9A, some components are seen transparently or omitted for easy understanding.

The semiconductor device illustrated in FIGS. 9A to 9D is a modification example of the semiconductor device illustrated in FIGS. 4A to 4D in Embodiment 2, and thus portions having functions similar to those in FIGS. 4A to 4D are hatched in the same manner and the detailed description thereof is omitted. The semiconductor device illustrated in FIGS. 9A to 9D uses an oxide stack 170 instead of the oxide stack 160 in the semiconductor device illustrated in FIGS. 4A to 4D.

The semiconductor device illustrated in FIGS. 9A to 9D includes the insulating film 104 formed over the substrate 102; the oxide stack 170 formed over the insulating film 104; the source electrode layer 108a and the drain electrode layer 108b_2 that are in contact with part of a top surface and the side surface in the channel formation direction of the oxide stack 170; the second source electrode layer 110a and the second drain electrode layer 110b_2 that are formed over the source electrode layer 108a and the drain electrode layer 108b_2 and in contact with part of the top surface of the oxide stack 170; the gate insulating film 112 that is formed over the second source electrode layer 110a and the second drain electrode layer 110b_2 and is in contact with the top surface of the oxide stack 170 between the second source electrode layer 110a and the second drain electrode layer 110b_2; the gate electrode layer 114a_2 overlapping with the oxide stack 170 with the gate insulating film 112 interposed therebetween; and the protective insulating film 116 formed over the gate insulating film 112 and the gate electrode layer 114a_2. Further, another insulating layer, a wiring, or the like may be formed over the protective insulating film 116. Note that the n-type region 107 is illustrated by the bolder broken line than the other lines.

In addition, as illustrated in FIGS. 9A and 9B, the semiconductor device in this embodiment includes the gate electrode layer 114a_1 and the gate electrode layer 114a_2 overlapping with the top surface of the oxide stack 170 and the gate electrode layer 114b_1 and the gate electrode layer 114b_2 overlapping with the side surface of the oxide stack 170. With the gate electrode layer 114b (the gate electrode layers 114b_1 and 114b_2 in FIGS. 9A and 9B) overlapping with the side surface of the oxide stack 170, a potential can be supplied from the side surface of the oxide stack 170. The threshold voltage of the oxide stack 170 can be controlled by supply of a potential from the side surface of the oxide stack 170. For example, when the oxide stack 170 is used for an n-channel transistor, the threshold voltage of the transistor can be shifted to the positive side by supply of a negative potential from the side surface of the gate electrode layer 114b. Thus, leakage current in the transistor can be reduced.

An example of the oxide stack 170 used in the semiconductor device illustrated in FIGS. 9A to 9D will be described here with reference to FIGS. 10A to 10C.

Figure 10A:
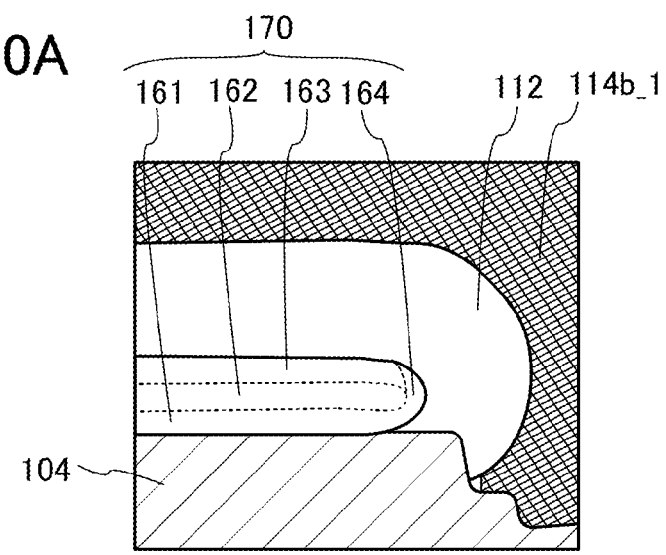
FIGS. 10A to 10C are each a cross-sectional view illustrating an oxide stack in accordance with one embodiment of the present invention.
Figure 10B:
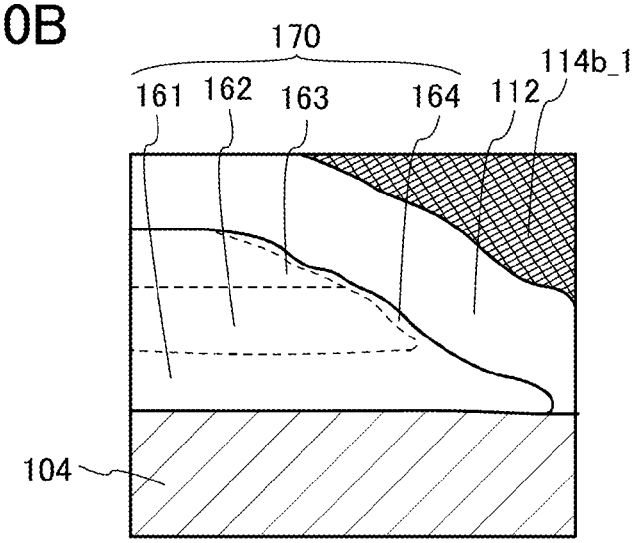
Figure 10C:
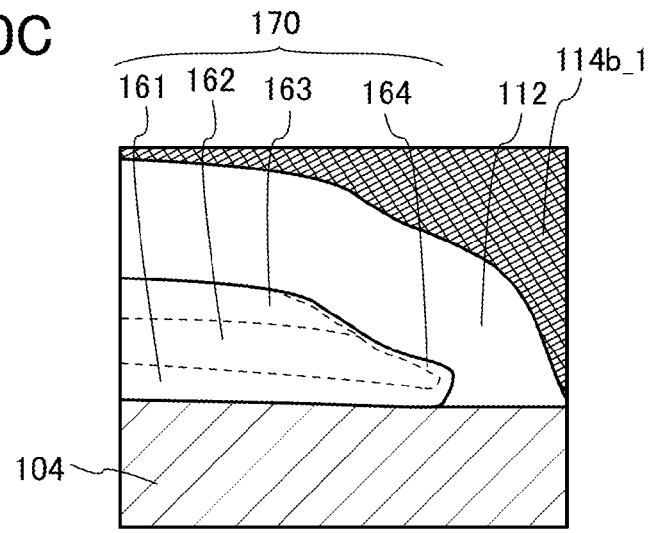

FIGS. 10A to 10C illustrate examples of cross-sectional structures of the oxide stack 170. The oxide stack 170 includes, over the insulating film 104, the first oxide layer 161 over the insulating film 104, the oxide semiconductor layer 162 over the first oxide layer 161, the second oxide layer 163 over the oxide semiconductor layer 162, and a third oxide layer 164 that is in contact with the side surface of the second oxide layer 163 and the side surface of the oxide semiconductor layer 162. The oxide semiconductor layer 162 is surrounded by the first oxide layer 161, the second oxide layer 163, and the third oxide layer 164. In addition, the third oxide layer 164 is in contact with the gate insulating film 112 and the gate electrode layer 114b_1 is formed in contact with the gate insulating film 112.

The oxide stack 170 illustrated in FIG. 10A has a curved surface with one arbitrary curvature radius or plural arbitrary curvature radii. In this case, at least a part of the surface of the third oxide layer 164 in contact with the gate insulating film 112 is a curved surface. As illustrated in FIG. 10A, the gate electrode layer 114b_1 may be in contact with the insulating film 104.

The third oxide layer 164 includes, for example, a material that can be applied to the first oxide layer 161. The third oxide layer 164 is formed as follows: for example, when the first oxide layer 161, the oxide semiconductor layer 162, and the second oxide layer 163 are etched by a dry etching method or the like, a reaction product of the first oxide layer 161 is attached to the side surfaces of the oxide semiconductor layer 162 and the second oxide layer 163.

Note that the first oxide layer 161, the second oxide layer 163, and the third oxide layer 164 cannot be strictly distinguished from each other in some cases. For that reason, the oxide semiconductor layer 162 can be said to be surrounded by the oxide.

Alternatively, the oxide stack 170 may have a structure illustrated in FIG. 10B. The oxide stack 170 illustrated in FIG. 10B has an inclined (tapered angle) region at an end portion. By formation of the inclined (tapered angle) region at the end portion, the coverage with the gate insulating film 112 can be improved. Alternatively, a structure in which part of the tapered region is cut as illustrated in FIG. 10C may be employed.

As described above, the semiconductor device in this embodiment includes the oxide stack which is a stacked-layer including the oxide semiconductor layer and the oxide layers formed over and under and in contact with the oxide semiconductor layer, and in the cross section of the oxide stack, the oxide stack has a curved surface or an inclined region. Because the cross-section of the oxide stack has a curved surface or an inclined curve surface, the coverage of the oxide stack with a layer to be formed thereover can be improved. Accordingly, a film can be formed uniformly over the oxide stack, and thus, intrusion of an impurity element into the oxide stack from a region with low film density or a region without the film formed can be inhibited so that deterioration of characteristics of the semiconductor device can be prevented. Therefore, a semiconductor device having stable characteristics can be provided.

This embodiment can be freely combined with any of the other embodiments in this specification.

Embodiment 4

In this embodiment, an example of a semiconductor memory device is described as an example of the semiconductor devices in the above embodiments.

An example of a semiconductor device in this embodiment includes a memory cell array including a plurality of memory cells that can store two or more bits of data.

An example of the memory cell array in the semiconductor device in this embodiment is described with reference to FIGS. 11A to 11C.

An example of a circuit configuration of the memory cell array in the semiconductor device in this embodiment is described first with reference to FIG. 11A.

The memory cell array illustrated in FIG. 11A includes a plurality of memory cells 300, a plurality of bit lines BL, a plurality of word lines WL (including a word line WL_1 and a word line WL_2), a plurality of capacitor lines CL (including a capacitor line CL_1 and a capacitor line CL_2), a source line SL, and a plurality of gate lines SGL (including a gate line SGL_a and a gate line SGL_b). Although the example in FIG. 11A illustrates two memory cells, this is a non-limiting example and memory cell arrays should be placed in matrix.

The potentials of the plurality of bit lines BL are each controlled by, for example, a driver circuit including a decoder.

The potentials of the plurality of word lines WL are each controlled by, for example, a driver circuit including a decoder.

The potentials of the plurality of capacitor lines CL are each controlled by, for example, a driver circuit including a decoder.

A constant potential, for example, is supplied to the source line SL.

A signal or a constant potential, for example, is supplied to each of the plurality of gate lines SGL. Note that the same signal or the same constant potential may be supplied to each of the plurality of gate lines SGL. When a signal is input into each of the plurality of gate lines SGL, the potentials of the plurality of gate lines SGL are controlled by a driver circuit using, e.g., a decoder.

The memory cell 300 includes a plurality of submemory cells 301 (including a submemory cell 301_1 and a submemory cell 301_2).

The plurality of submemory cells 301 each have a function of storing one or more bit(s) of data. The plurality of submemory cells 301 can have a function of storing multiple bits of data. For example, four kinds of potentials are used as the potentials for the bit line BL, and thus the number of bits of data that can be stored in one submemory cell can be increased. There is no particular limitation on the number of bits, and for example, two bits, three bits, four bits, six bits, or eight bits can be employed.

Each of the submemory cells 301 includes a transistor 311, a capacitor 312, and a transistor 313.

A source of the transistor 311 is electrically connected to one of the plurality of bit lines BL.

The transistor 311 serves as a selection transistor for determining whether or not data is written.

For the transistors 311 of the plurality of submemory cells 301, the semiconductor device described in any of Embodiments described above can be used.

In this case, in one memory cell 300, the transistors 311 included in the plurality of submemory cells 301 are formed using the same oxide layer. For example, the same oxide layer is used for the transistors 311 in the submemory cell 301_1 and the transistor 311 in the submemory cell 301_2.

The threshold voltages of the transistors 311 included in the plurality of submemory cells 301 are controlled by the plurality of gate lines SGL. For example, in FIG. 11A, the threshold voltages of the transistor 311 in the submemory cell 301_1 and the transistor 311 in the submemory cell 301_2 are controlled by the gate line SGL_a and the gate line SGL_b.

In this manner, the same gate lines SGL are used in common for the plurality of submemory cells 301, and thus the number of the gate lines SGL can be reduced as compared with a case where a gate line SGL is provided for each submemory cell 301.

One of a pair of electrodes of the capacitor 312 is electrically connected to a drain of the transistor 311, and the other thereof is electrically connected to one of the plurality of capacitor lines CL.

The capacitor 312 serves as storage capacitors for holding data.

A gate of the transistor 313 is electrically connected to the drain of the transistor 311, one of a source and a drain of the transistor 313 is electrically connected to one of the plurality of bit lines BL, and the other thereof is electrically connected to the source line SL.

The transistor 313 serves as an output transistor which sets a value of data to be output.

That is the description of the configuration example of the memory cell array illustrated in FIG. 11A.

Further, an example of a method for driving the memory cell array in FIG. 11A is described with reference to FIGS. 11B and 11C. FIGS. 11B and 11C are timing charts illustrating an example of a method for driving the memory cell array in FIG. 11A. Here, an example where one bit of data is sequentially written to the submemory cell 301_1 and the submemory cell 301_2 and then the data written is read is described. In addition, the transistor 311 is an n-channel transistor, while the transistor 313 is a p-channel transistor.

First, when data is written to the submemory cell 301_1, the potential of the word line WL_1 is set to a potential VH to turn on the transistor 311 in the submemory cell 301_1 in a period T11 illustrated in FIG. 11B. The potential VH is, for example, a potential higher than the reference potential (e.g., high power supply potential). The potential VH corresponds to a high level of potential.

In the submemory cell 301_1, when the transistor 311 is on, the gate potential of the transistor 313 becomes equal to the potential of the bit line BL. Thus, data is written to the submemory cell 301_1.

Next, in a period T12, the potential of the word line WL_1 is set to a potential VL to turn off the transistor 311 in the submemory cell 301_1, and the potential of the word line WL_2 is set to a potential VH to turn on the transistor 311 in the submemory cell 301_2. The potential VL is, for example, a potential lower than or equal to the reference potential. The potential VL corresponds to a low level of potential.

In the submemory cell 301_2, when the transistor 311 is on, the gate potential of the transistor 313 becomes equal to the potential of the bit line BL. Thus, data is written to the submemory cell 301_2.

Through the above steps, two bits of data is written to the memory cell 300.

After that, in a period T13, the potentials of the word line WL_1 and the word line WL_2 are set to the potential VL to turn off the transistors 311 in the submemory cell 301_1 and the submemory cell 301_2. Thus, written data is held.

In addition, during the period from T11 to T13, the potentials of the gate line SGL_a and the gate line SGL_b are set to a potential VL2. The potential VL2 is a negative potential. The potentials of the gate line SGL_a and the gate line SGL_b are set to the potential VL2, so that the threshold voltages of the transistors 311 in the submemory cell 301_1 and the submemory cell 301_2 are shifted to the positive side. Thus, leakage current of the transistors 311 in the submemory cell 301_1 and the submemory cell 301_2 can be reduced.

Gates of the transistors 313 in the submemory cell 301_1 and the submemory cell 301_2 are in floating states at this time, and thus electric charge accumulated in the gates of the transistors 313 are held for a certain period.

In addition, when the above-described operation is performed for the memory cells 300 in each row, data can be written to all the memory cells 300.

Further, when data is read out from the memory cell 300, in a period T21 illustrated in FIG. 11C, the potentials of the word line WL_1 and the word line WL_2 are set to the potential VL, and thereby the transistors 311 in the submemory cell 301_1 and the submemory cell 301_2 are turned off. In addition, the potential of the capacitor line CL_1 is set to the potential VL, while the potential of the capacitor line CL_2 is set to the potential VH.

At this time, in the submemory cell 301_1, the resistance of the transistor 313 depends on the gate potential of the transistor 313. Accordingly, a potential corresponding to a value of current flowing between the source and the drain of the transistor 313 can be read out as data from the submemory cell 301_1 via the bit line BL.

Next, in a period T22, the potentials of the word line WL_1 and the word line WL_2 are set to the potential VL, so that the transistors 311 in the submemory cell 301_1 and submemory cell 301_2 remain off. In addition, the potential of the capacitor line CL_1 is set to the potential VH, while the potential of the capacitor line CL_2 is set to the potential VL.

At this time, in the submemory cell 301_2, a potential corresponding to a value of current flowing between the source and the drain of the transistor 313 can be read out as data from the submemory cell 301_1 via the bit line BL.

Further, when the above-described operation is repeatedly performed for the memory cells 300 in each row, the data can be read from all the memory cells 300.

That is description of the example of the method for driving the semiconductor device illustrated in FIG. 11A.

Figure 12:
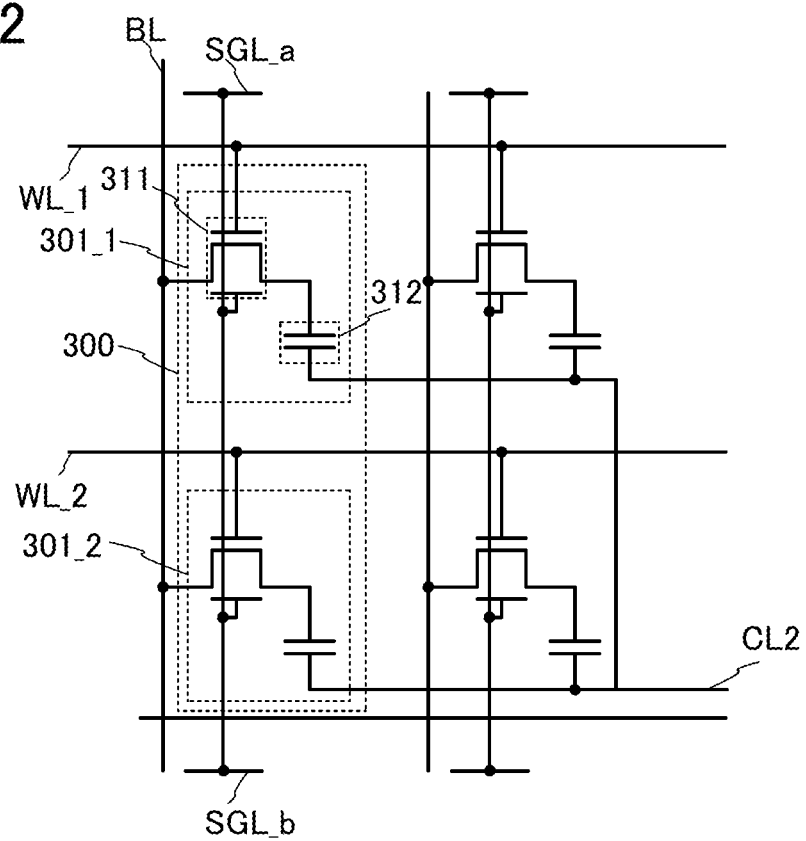
FIG. 12 is a diagram illustrating an example of a memory cell.

Note that, as illustrated in FIG. 12, a configuration may be employed, in which no transistor 313 is provided in each submemory cell 301.

In this case, a memory cell array illustrated in FIG. 12 includes a capacitor line CL2 instead of the plurality of capacitor lines CL. In addition, no source line SL is provided.

A constant potential is supplied to the capacitor line CL2.

In addition, one of a pair of electrodes of the capacitor 312 is electrically connected to the drain of the transistor 311, and the other thereof is electrically connected to the capacitor line CL2

In the memory cell illustrated in FIG. 12, in a data writing period, the potentials of the word lines WL are sequentially set to the potential VH for the submemory cells 301 to turn on the transistors 311, so that data can be rewritten via the bit line BL. In addition, in a data reading period, the potential of the bit line is set to a reading potential or floating in advance, and the potentials of the word lines WL are sequentially set to the potential VH for submemory cells 301 to turn on the transistors 311, so that data can be read out via the bit line BL.

Further, when the potential of the bit line BL is compared with a predetermined potential, data can be read out from the memory cell 300.

At this time, with use of a transistor with low off-state current as the transistor 311, electric charge accumulated in one of the pair of electrodes of the capacitor 312 can be held for a long period when the transistor 311 is off.

Thus, the memory cell illustrated in FIG. 12 can hold electric charge accumulated in the capacitor 312 for a long time, since the off-state current of the transistor 311 is extremely low. In other words, power consumption can be adequately reduced because refresh operation becomes unnecessary or the frequency of refresh operation can be extremely low. Moreover, stored data can be held for a long time even when power is not supplied.

Figure 13A:
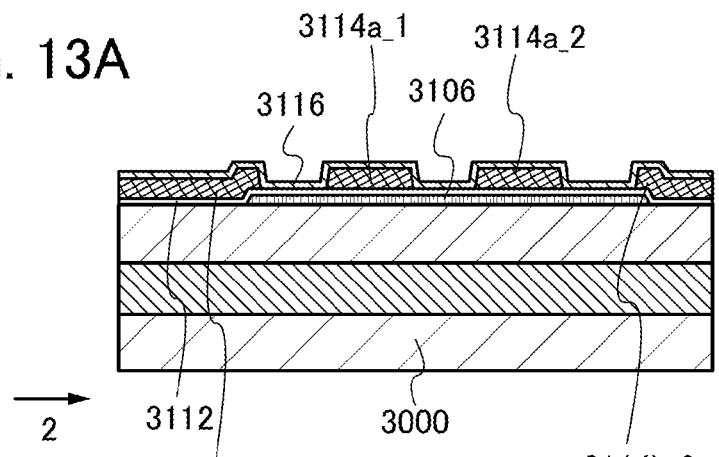
FIGS. 13A to 13C illustrate a structure of a memory cell.

Next, a structural example of the memory cell 300 illustrated in FIGS. 11A to 11C will be described with reference to FIGS. 13A to 13C. FIG. 13A is a cross-sectional view of the memory cell in a direction substantially parallel to the second direction 2 intersecting with the first direction 1, FIG. 13B is a cross-sectional view of the memory cell in a direction substantially parallel to the first direction 1, and FIG. 13C is a cross-sectional view of the memory cell in a direction substantially parallel to the first direction 1, which illustrates a part different from FIG. 13B.

Figure 13B:
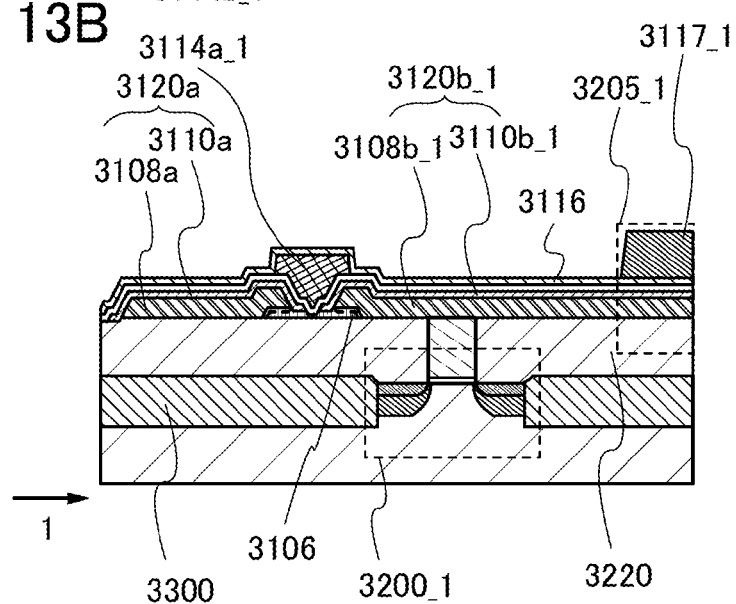
Figure 13C:
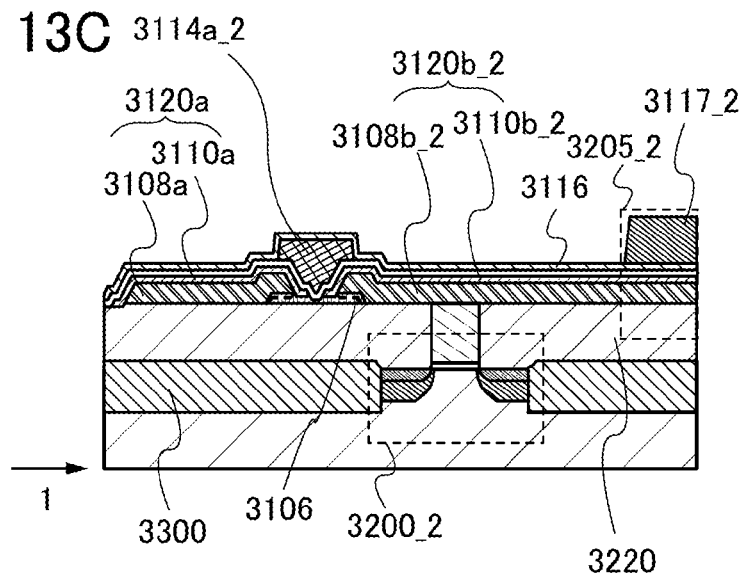

The memory cell illustrated in FIGS. 13A to 13C includes a transistor 3200_1 and a transistor 3200_2 formed using a first semiconductor material in its lower portion, and includes a transistor formed using a second semiconductor material, a capacitor 3205_1, and a capacitor 3205_2 in its upper portion.

Here, the first semiconductor material and the second semiconductor material preferably have different band gaps. For example, the first semiconductor material may be a semiconductor material (such as silicon) other than an oxide semiconductor, and the second semiconductor material may be an oxide semiconductor including an oxide semiconductor material. A transistor including, for example, crystalline silicon as a material other than an oxide semiconductor can operate at high speed easily. On the other hand, a transistor including an oxide semiconductor enables electric charge to be stored for a long time because it has low off-state current.

The transistor 3200_1 and the transistor 3200_2 in FIGS. 13A to 13C each include a channel formation region provided in the substrate 3000 including a semiconductor material (such as crystalline silicon), impurity regions provided such that the channel formation region is sandwiched therebetween, intermetallic compound regions provided in contact with the impurity regions, a gate insulating film provided over the channel formation region, and a gate electrode layer provided over the gate insulating film. Note that a transistor having a source electrode layer or a drain electrode layer not explicitly illustrated in the drawing may be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" may include a source region.

Further, an element isolation insulating layer 3300 is formed on the substrate 3000 so as to surround the transistor 3200_1 or the transistor 3200_2, and an oxide insulating film 3220 is formed so as to cover the transistor 3200_1 or the transistor 3200_2. Note that the element isolation insulating layer 3300 can be formed by an element isolation technique such as local oxidation of silicon (LOCOS) or shallow trench isolation (STI).

For example, the transistor 3200_1 or the transistor 3200_2 formed using a crystalline silicon substrate can operate at high speed. With the use of the transistors as output transistors, data can be read at high speed. Accordingly, the transistor 3200_1 and the transistor 3200_2 correspond to the transistor 313 in the submemory cell 301_1 and the transistor 313 in the submemory cell 301_2 illustrated in FIG. 11A, respectively, for example.

In addition, as treatment prior to formation of the transistor, the capacitor 3205_1, and the capacitor 3205_2 in the upper portion, CMP treatment is performed on the oxide insulating film 3220 covering the transistor 3200_1 or the transistor 3200_2, whereby the oxide insulating film 3220 is planarized and, at the same time, upper surfaces of the gate electrode layer of the transistor 3200_1 and transistor 3200_2 are exposed.

Further, the memory cell includes an oxide layer 3106 formed over the oxide insulating film 3220; a source electrode layer 3120a (a source electrode layer 3108a and a source electrode layer 3110a), a drain electrode layer 3120b_1 (a drain electrode layer 3108b_1 and a drain electrode layer 3110b_1), a drain electrode layer 3120b_2 (a drain electrode layer 3108b_2 and a drain electrode layer 3110b_2) which are provided in contact with the oxide layer 3106; a gate insulating film 3112 formed over the oxide layer 3106, the source electrode layer 3120a, the drain electrode layer 3120b_1, and the drain electrode layer 3120b_2; a gate electrode layer 3114a_1 and a gate electrode layer 3114a_2 formed over the gate insulating film 3112; a gate electrode layer 3114b_1 and a gate electrode layer 3114b_2 overlapping with the side surface of the oxide layer 3106 with the gate insulating film 3112 interposed therebetween; and a protective insulating film 3116 formed over the gate electrode layer 3114a_1 and the gate electrode layer 3114a_2.

Further, the memory cell includes a capacitor electrode layer 3117_1 overlapping with the drain electrode layer 3120b_1 with the protective insulating film 3116 interposed therebetween and a capacitor electrode layer 3117_2 overlapping with the drain electrode layer 3120b_2 with the protective insulating film 3116 interposed therebetween.

The oxide layer 3106 corresponds to the oxide layer 106 illustrated in FIGS. 1A to 1D, for example. A layer of a material applicapable to the oxide layer 106 can be used for the oxide layer 3106. An n-type region is represented by a broken line.

The source electrode layer 3108a, the drain electrode layer 3108b_1, and the drain electrode layer 3108b_2 correspond to, for example, the source electrode layer 108a, the drain electrode layer 108b_1, and the drain electrode layer 108b_2, respectively, illustrated in FIGS. 1A to 1D. Layers of materials applicable to the source electrode layer 108a, the drain electrode layer 108b_1, and the drain electrode layer 108b_2 can be used for the source electrode layer 3108a, the drain electrode layer 3108b_1, and the drain electrode layer 3108b_2.

In addition, the drain electrode layer 3108b_1 is in contact with the gate electrode layer of the transistor 3200_1 serving as the output transistor. Thus, in accordance with the potential of the gate electrode layer 3114a_1, electric charge accumulated in the gate electrode layer of the transistor 3200_1 can be held as first data. In addition, the drain electrode layer 3108b_2 is in contact with the gate electrode layer of the transistor 3200_2 serving as the output transistor. Thus, in accordance with the potential of the gate electrode layer 3114a_2, electric charge accumulated in the gate electrode layer of the transistor 3200_2 can be held as second data. As described above, the first and the second data can be two or more bits of data.

The source electrode layer 3110a, the drain electrode layer 3110b_1, and the drain electrode layer 3110b_2 correspond to, for example, the source electrode layer 110a, the drain electrode layer 110b_1, and the drain electrode layer 110b_2, respectively, illustrated in FIGS. 1A to 1D. Layers of materials applicapable to the source electrode layer 110a, the drain electrode layer 110b_1, and the drain electrode layer 110b_2 can be used for the source electrode layer 3110a, the drain electrode layer 3110b_1, and the drain electrode layer 3110b_2.

The source electrode layer 3108a and the source electrode layer 3110a serve as the source of the transistor 311 in the submemory cell 301_1 illustrated in FIG. 11A to 11C. Further, the source electrode layer 3110a may be connected to another wiring layer serving as the bit line BL.

In addition, the drain electrode layer 3108b_1 and the drain electrode layer 3110b_1 serve as the drain of the transistor 311 in the submemory cell 301_1 illustrated in FIGS. 11A to 11C.

In addition, the drain electrode layer 3108b_2 and the drain electrode layer 3110b_2 serve as the drain of the transistor 311 in the submemory cell 301_2 illustrated in FIGS. 11A to 11C.

The gate insulating film 3112 corresponds to, for example, the gate insulating film 112 illustrated in FIGS. 1A to 1D. A film of a material applicapable to the gate insulating film 112 can be used for the gate insulating film 3112.

The gate electrode layer 3114a_1, the gate electrode layer 3114a_2, the gate electrode layer 3114b_1, and the gate electrode layer 3114b_2 correspond to, for example, the gate electrode layer 114a_1, the gate electrode layer 114a_2, the gate electrode layer 114b_1, and the gate electrode layer 114b_2, respectively, illustrated in FIGS. 1A to 1D. Layers of materials applicapable to the gate electrode layer 114a_1, the gate electrode layer 114a_2, the gate electrode layer 114b_1, and the gate electrode layer 114b_2 can be used for the gate electrode layer 3114a_1, the gate electrode layer 3114a_2, the gate electrode layer 3114b_1, and the gate electrode layer 3114b_2.

The gate electrode layer 3114a_1 serves as the gate of the transistor 311 in the submemory cell 301_1 illustrated in FIGS. 11A to 11C. Further, the gate electrode layer 3114a_1 may be electrically connected to another wiring layer serving as the word line WL_1.

The gate electrode layer 3114a_2 serves as the gate of the transistor 311 in the submemory cell 301_2 illustrated in FIGS. 11A to 11C. Further, the gate electrode layer 3114a_2 may be electrically connected to another wiring layer serving as the word line WL_2.

The protective insulating film 3116 corresponds to, for example, the protective insulating film 116 illustrated in FIGS. 1A to 1D. A layer of a material applicapable to the protective insulating film 116 can be used for the protective insulating film 3116.

Layers of materials applicapable to the drain electrode layer 3108b_1 and the drain electrode layer 3108b_2, for example, can be used for the capacitor electrode layer 3117_1 and the capacitor electrode layer 3117_2.

In FIGS. 13A to 13C, the capacitor 3205_1 includes the drain electrode layer 3120b_1, the protective insulating film 3116, and the capacitor electrode layer 3117_1. The capacitor 3205_1 corresponds to the capacitor 312 of the submemory cell 301_1 illustrated in FIGS. 11A to 11C.

In FIG. 13A to FIG. 13C, the capacitor 3205_2 includes the drain electrode layer 3120b_2, the protective insulating film 3116, and the capacitor electrode layer 3117_2. The capacitor 3205_2 corresponds to the capacitor 312 of the submemory cell 301_2 illustrated in FIGS. 11A to 11C.

Further, the capacitor electrode layer 3117_1 may be electrically connected to another wiring layer serving as the capacitor line CL_1.

In addition, the capacitor electrode layer 3117_2 may be electrically connected to another wiring layer serving as the capacitor line CL_2.

Since the off-state current of the transistor corresponding to the transistor 311 illustrated in FIG. 13A is low, stored data can be held for a long time with the transistor. In other words, power consumption can be sufficiently reduced because a semiconductor device in which refresh operation is unnecessary or the frequency of refresh operation is extremely low can be provided.

As illustrated in FIGS. 13A to 13C, the transistor 3200_1, the transistor 3202_2, and the transistor corresponding to the transistor 311 can be formed to overlap with each other; therefore, the area occupied by these transistors can be reduced. Accordingly, the degree of integration of the semiconductor device can be increased.

That is the description of the semiconductor device in this embodiment.

In addition, in the example of the semiconductor device in this embodiment, a field-effect transistor with low off-state current is used as the selection transistor, whereby a data retention period can be lengthened. Thus, power consumption can be reduced.

In addition, in the example of the semiconductor device in this embodiment, transistors each having a plurality of gates are used for a plurality of selection transistors in the submemory cell. Further, another gate electrode layer is overlapped with the side surface of the oxide layer of each transistor, so that the threshold voltages of the plurality of transistors can be controlled. In addition, it is not necessary to provide a gate electrode layer controlling the threshold voltage of the selection transistor for each submemory cell, and thus the number of wirings can be reduced.

This embodiment can be freely combined with any of the other embodiments in this specification.

Embodiment 5

In this embodiment, examples of electronic devices using semiconductor devices described in Embodiment 1 to Embodiment 4 will be described.

The semiconductor devices described in Embodiment 1 to Embodiment 4 can be applied to a wide variety of electronic devices (including amusement machines). Examples of the electronic devices include display devices of televisions, monitors, and the like, lighting devices, desktop personal computers and notebook personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, mobile phones, car phones, portable game machines, calculators, portable information terminals, electronic notebooks, e-book readers, electronic translators, audio input devices, cameras such as video cameras and digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers. In addition, the examples include alarm devices such as smoke detectors, gas alarm devices, and security alarm devices. Further, the examples include industrial equipment such as guide lights, traffic lights, belt conveyors, elevators, escalators, industrial robots, and power storage systems. In addition, moving objects and the like driven by oil engines or electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, and spacecrafts. Specific examples of such electronic devices are illustrated in FIG. 14, FIGS. 15A to 15C, and FIGS. 16A to 16C.

First, as an example of the alarm device, a structure of a fire alarm is described with reference to FIG. 14. A fire alarm in this specification refers to any device which raises an alarm over fire occurrence instantly, and for example, a residential fire alarm, an automatic fire alarm system, and a fire detector used for the automatic fire alarm system are included in its category.

Figure 14:
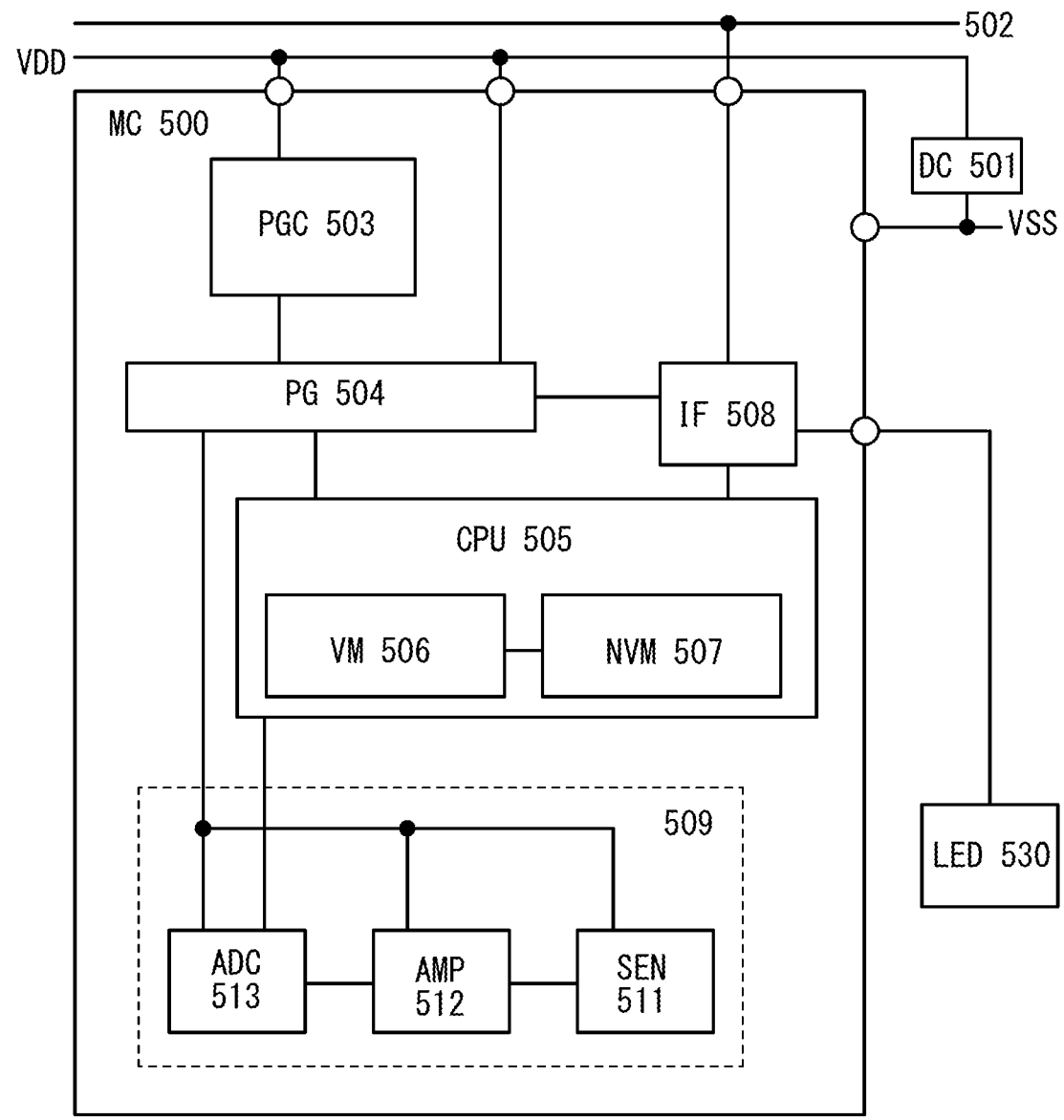
FIG. 14 is a block diagram of a semiconductor device.

The alarm device illustrated in FIG. 14 includes at least a microcomputer 500. Here, the microcomputer 500 is provided in the alarm device. The microcomputer 500 includes a power gate controller 503 electrically connected to a high potential power supply line VDD, a power gate 504 electrically connected to the high potential power supply line VDD and the power gate controller 503, a central processing unit (CPU) 505 electrically connected to the power gate 504, and a sensor portion 509 electrically connected to the power gate 504 and the CPU 505. Further, the CPU 505 includes a volatile memory portion 506 and a nonvolatile memory portion 507.

The microcomputer 500 illustrated in FIG. 14 can use the semiconductor device in any of the above-described embodiments for the volatile memory portion 506 of the CPU 505.

The CPU 505 is electrically connected to a bus line 502 through an interface 508. The interface 508 as well as the CPU 505 is electrically connected to the power gate 504. As a bus standard of the interface 508, an I²C bus can be used, for example. A light-emitting element 530 electrically connected to the power gate 504 through the interface 508 is provided in the alarm device described in this embodiment.

The light-emitting element 530 is preferably an element which emits light with high directivity, and for example, an organic EL element, an inorganic EL element, or a light-emitting diode (LED) can be used.

The power gate controller 503 includes a timer and controls the power gate 504 with the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm device operates in such a manner, whereby power consumption can be reduced compared with a case where power is continuously supplied to the above structures.

When a transistor is used as the power gate 504, it is preferable to use a transistor which has an extremely low off-state current and is used for the nonvolatile memory portion 507, for example, a transistor including an oxide semiconductor. With the use of such a transistor, leakage current can be reduced when supply of power is stopped by the power gate 504, so that a reduction in power consumption of the alarm device can be achieved.

A direct-current power source 501 can be provided in the alarm device described in this embodiment so that power is supplied from the direct-current power source 501 to the high potential power supply line VDD. An electrode of the direct-current power source 501 on a high potential side is electrically connected to the high potential power supply line VDD, and an electrode of the direct-current power source 501 on a low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, e.g., a ground potential (GND).

When a battery is used as the direct-current power source 501, for example, a battery case including an electrode electrically connected to the high potential power supply line VDD, an electrode electrically connected to the low potential power supply line VSS, and a housing which can hold the battery, is provided in a housing. Note that the alarm device described in this embodiment does not necessarily include the direct-current power source 501 and may have, for example, a structure in which power is supplied from an alternate-current power source provided outside the alarm device through a wiring.

As the above battery, a secondary battery such as a lithium ion secondary battery (also called a lithium ion storage battery or a lithium ion battery) can be used. Further, a solar battery is preferably provided to charge the secondary battery.

The sensor portion 509 measures a physical quantity relating to an abnormal situation and transmits a measured value to the CPU 505. The physical quantity relating to an abnormal situation depends on the usage of the alarm device, and in an alarm device functioning as a fire alarm, a physical quantity relating to a fire is measured. Accordingly, the sensor portion 509 measures the amount of light as the physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The optical sensor 511, the amplifier 512, and the AD converter 513 which are provided in the sensor portion 509, and the light-emitting element 530 operate when the power gate 504 allows supply of power to the sensor portion 509.

In the above manner, the sensor portion 509 including the optical sensor 511 can be incorporated into the microcomputer 500, so that the number of components can be reduced and the housing of the alarm device can be reduced. Note that for free circuit layout of the optical sensor or the photoelectric conversion element, the optical sensor or the photoelectric conversion element may be externally provided so as to be electrically connected to the microcomputer 500.

In the alarm device including the above-described IC chip, the CPU 505 in which a plurality of circuits including the semiconductor device described in any of the above embodiments are combined and mounted on one IC chip is used.

Figure 15A:
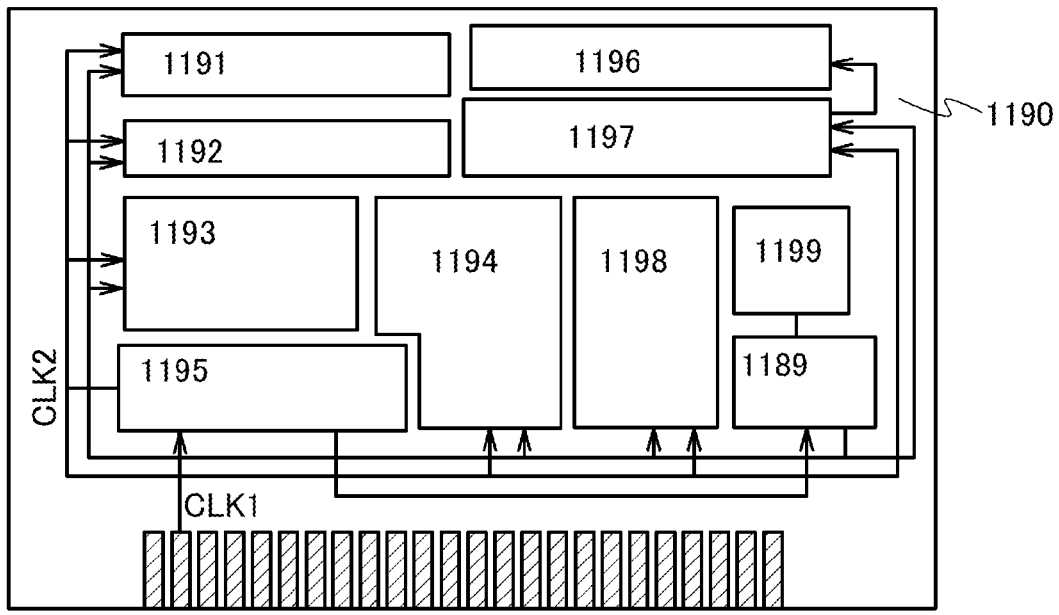
FIGS. 15A to 15C are block diagrams of a semiconductor device.
Figure 15B:
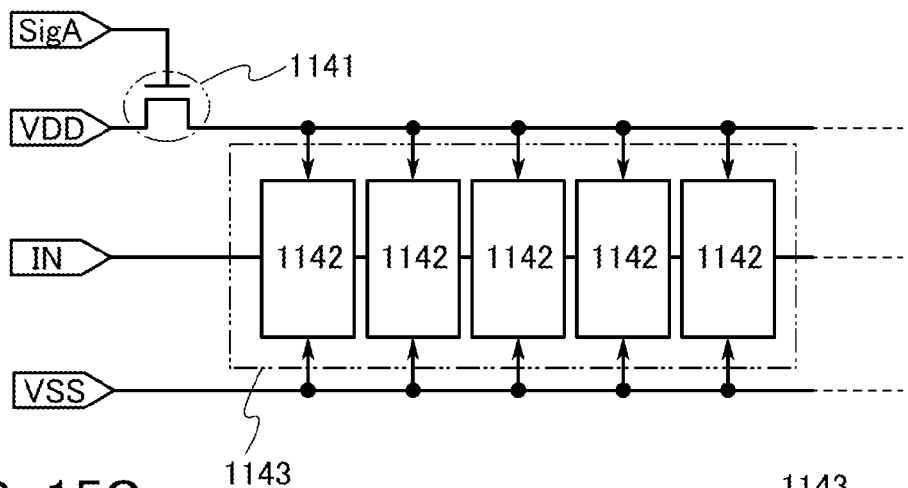
Figure 15C:
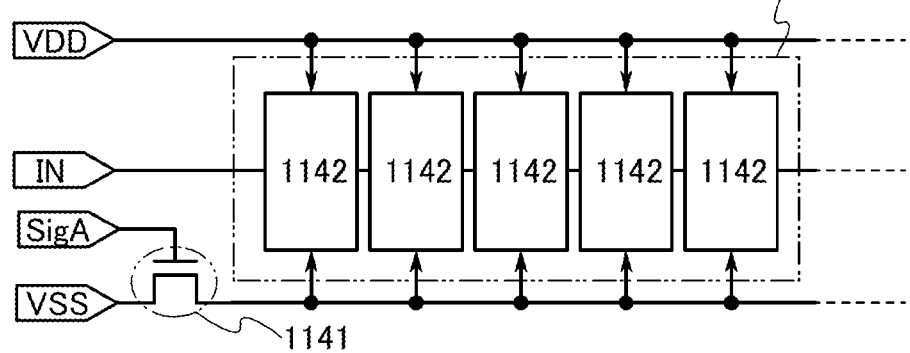

FIGS. 15A to 15C are block diagrams illustrating a specific configuration of a CPU at least partly including any of the semicondcutor devices described in Embodiments 1 to 4.

The CPU illustrated in FIG. 15A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 15A is one example in which the configuration is simplified, and an actual CPU may have a great variety of configurations depending on the application.

An instruction that is input to the CPU through the bus interface 1198 is input to the instruction decoder 1193 and decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates a signal for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 15A, a memory cell is provided in the register 1196. For the memory cell of the register 1196, any of the transistors described in the above embodiments can be used.

In the CPU illustrated in FIG. 15A, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 15B or FIG. 15C. Circuits illustrated in FIGS. 15B and 15C are described below.

FIGS. 15B and 15C each illustrate an example of the configuration of a memory circuit in which any of the transistors described in the above embodiments is used as a switching element which controls supply of a power supply potential to a memory cell.

The memory device illustrated in FIG. 15B includes a switching element 1141 and a memory cell group 1143 including a plurality of memory cells 1142. Specifically, for each of the memory cells 1142, any of the transistors described in the above embodiments can be used. Each of the memory cells 1142 included in the memory cell group 1143 is supplied with the high level power supply potential VDD via the switching element 1141. Further, each of the memory cells 1142 included in the memory cell group 1143 is supplied with a potential of a signal IN and the low level power supply potential VSS.

In FIG. 15B, any of the transistors described in the above embodiments is used as the switching element 1141, and the switching of the transistor is controlled by a signal SigA supplied to a gate electrode layer thereof.

Note that FIG. 15B illustrates the configuration in which the switching element 1141 includes only one transistor; however, without particular limitation, the switching element 1141 may include a plurality of transistors. In the case where the switching element 1141 includes a plurality of transistors which function as switching elements, the plurality of transistors may be connected to each other in parallel, in series, or in combination of parallel connection and series connection.

Although the switching element 1141 controls the supply of the high level power supply potential VDD to each of the memory cells 1142 included in the memory cell group 1143 in FIG. 15B, the switching element 1141 can control the supply of the low level power supply potential VSS.

FIG. 15C illustrates an example of a memory device in which each of the memory cells 1142 included in the memory cell group 1143 is supplied with the low level power supply potential VSS via the switching element 1141. The supply of the low level power supply potential VSS to each of the memory cells 1142 included in the memory cell group 1143 can be controlled by the switching element 1141.

Data can be held even when the switching element is provided between the memory cell group and a node to which the power supply potential VDD or the power supply potential VSS is supplied, an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

Figure 16A:
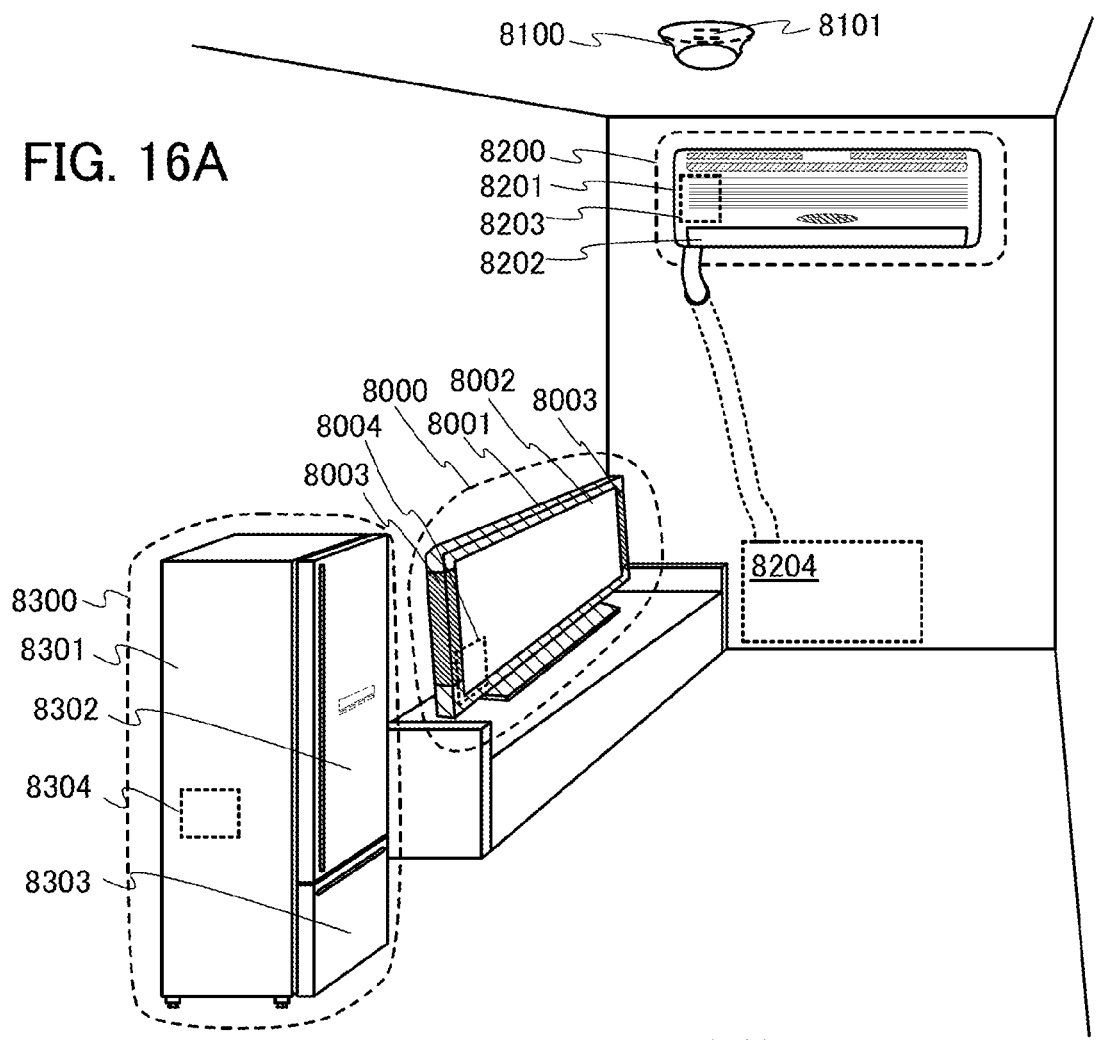
FIGS. 16A to 16C illustrate electronic devices to which a semiconductor device can be applied.

In FIG. 16A, an alarm device 8100 is a residential fire alarm, which includes a sensor portion and a microcomputer 8101. The microcomputer 8101 is an example of electronic devices each including a CPU in which any of the transistors described in the above embodiments is used.

In FIG. 16A, an air conditioner including an indoor unit 8200 and an outdoor unit 8204 is an example of electronic devices each including the CPU in which any of the transistors described in the above embodiments is used. Specifically, the indoor unit 8200 includes a housing 8201, an air outlet 8202, a CPU 8203, and the like. Although the CPU 8203 is provided in the indoor unit 8200 in FIG. 16A, the CPU 8203 may be provided in the outdoor unit 8204. Alternatively, the CPU 8203 may be provided in both the indoor unit 8200 and the outdoor unit 8204. By using any of the transistors described in the above embodiments as the CPU in the air conditioner, power consumption of the air conditioner can be reduced.

In FIG. 16A, an electric refrigerator-freezer 8300 is an example of an electronic device including the CPU in which any of the transistors described in the above embodiments is used. Specifically, the electric refrigerator-freezer 8300 includes a housing 8301, a door for a refrigerator 8302, a door for a freezer 8303, a CPU 8304, and the like. In FIG. 16A, the CPU 8304 is provided in the housing 8301. When any of the transistors described in the above embodiments is used as the CPU 8304 of the electric refrigerator-freezer 8300, power consumption of the electric refrigerator-freezer 8300 can be reduced.

Figure 16B:
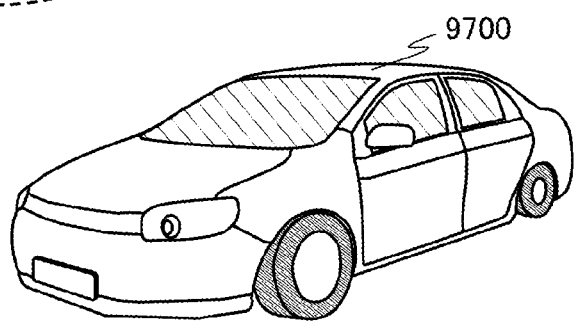
Figure 16C:
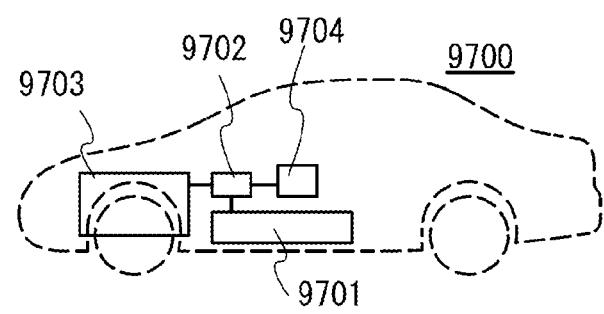

FIGS. 16B and 16C illustrate an example of an electric vehicle which is an example of such electronic devices. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When any of the transistors described in the above embodiments is used for the CPU in the electric vehicle 9700, power consumption of the electric vehicle 9700 can be reduced.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in response to the control signal of the processing unit 9704 to control the output of the driving device 9703. When the AC motor is used, although not illustrated, an inverter which converts direct current into alternate current is also incorporated.

This embodiment can be freely combined with any of the other embodiments in this specification.

This application is based on Japanese Patent Application serial no. 2012-234203 filed with Japan Patent Office on Oct. 23, 2012 and Japanese Patent Application serial no. 2012-249839 filed with Japan Patent Office on Nov. 14, 2012, the entire contents of which are hereby incorporated by reference.

What is claimed is:

1. A semiconductor device comprising a first transistor, the first transistor comprising:
   an oxide layer comprising a channel formation region;
   a source electrode layer in contact with the oxide layer;
   a first drain electrode layer in contact with the oxide layer;
   a second drain electrode layer in contact with the oxide layer;
   a gate insulating film in contact with the oxide layer;
   a first gate electrode layer overlapping with a part of the source electrode layer, the first drain electrode layer, and a part of the oxide layer with the gate insulating film interposed therebetween;
   a second gate electrode layer overlapping with the other part of the source electrode layer, the second drain electrode layer, and the other part of the oxide layer with the gate insulating film interposed therebetween; and
   a third gate electrode layer overlapping with a side surface of the oxide layer with the gate insulating film interposed therebetween,
   wherein the first drain electrode layer and the second drain electrode layer are separated from each other by a space overlapping with the oxide layer.

2. The semiconductor device according to claim 1,
   wherein the source electrode layer and the first drain electrode layer are placed in substantially parallel to a channel length direction of the first transistor,
   wherein the source electrode layer and the second drain electrode layer are placed in substantially parallel to the channel length direction of the first transistor, and
   wherein the first and the second gate electrode layers are placed in substantially parallel to a channel width direction of the first transistor.

3. The semiconductor device according to claim 1,
   wherein the oxide layer comprises crystal, and
   wherein c-axes of the crystal are aligned in a direction parallel to a normal vector of a surface where the oxide layer is formed or a normal vector of a surface of the oxide layer.

4. The semiconductor device according to claim 1,
   wherein the oxide layer comprises crystal, and
   wherein triangular or hexagonal atomic arrangement is formed when seen from a direction perpendicular to an a-b plane of the crystal, and metal atoms are arranged in a layered manner or metal atoms and oxygen atoms are arranged in a layered manner when seen from a direction perpendicular to c-axes of the crystal.

5. The semiconductor device according to claim 1, wherein the oxide layer comprises at least one selected from the group consisting of an In-based metal oxide, a Zn-based metal oxide, an In—Zn-based metal oxide, and an In—Ga—Zn-based metal oxide.

6. The semiconductor device according to claim 1, further comprising:
   a second transistor having a gate electrode layer electrically connected to the first drain electrode layer; and
   a third transistor having a gate electrode layer electrically connected to the second drain electrode layer,
   wherein electric charge accumulated in the gate electrode layer of the second transistor is held as first data in accordance with a potential of the first gate electrode layer, and
   wherein electric charge accumulated in the gate electrode layer of the third transistor is held as second data in accordance with a potential of the second gate electrode layer.

7. The semiconductor device according to claim 6, wherein the first data and the second data are two or more bits of data.

8. A semiconductor device comprising a first transistor, the first transistor comprising:
   a first oxide layer;
   a second oxide layer;
   an oxide semiconductor layer comprising a channel formation region between the first oxide layer and the second oxide layer;
   a source electrode layer electrically connected to the oxide semiconductor layer;
   a first drain electrode layer electrically connected to the oxide semiconductor layer;
   a second drain electrode layer electrically connected to the oxide semiconductor layer;
   a gate insulating film over the oxide semiconductor layer;
   a first gate electrode layer overlapping with a part of the source electrode layer, the first drain electrode layer, and a part of the oxide semiconductor layer with the gate insulating film interposed therebetween;

a second gate electrode layer overlapping with the other part of the source electrode layer, the second drain electrode layer, and the other part of the oxide semiconductor layer with the gate insulating film interposed therebetween; and a third gate electrode layer overlapping with a side surface of the oxide semiconductor layer with the gate insulating film interposed therebetween, wherein the first drain electrode layer and the second drain electrode layer are separated from each other by a space overlapping with the oxide semiconductor layer.

9. The semiconductor device according to claim 8, wherein the source electrode layer and the first drain electrode layer are placed in substantially parallel to a channel length direction of the first transistor, wherein the source electrode layer and the second drain electrode layer are placed in substantially parallel to the channel length direction of the first transistor, and wherein the first and the second gate electrode layers are placed in substantially parallel to a channel width direction of the first transistor.

10. The semiconductor device according to claim 8, wherein the oxide semiconductor layer comprises crystal, and wherein c-axes of the crystal are aligned in a direction parallel to a normal vector of a surface where the oxide semiconductor layer is formed or a normal vector of a surface of the oxide semiconductor layer.

11. The semiconductor device according to claim 8, wherein the oxide semiconductor layer comprises crystal, and wherein triangular or hexagonal atomic arrangement is formed when seen from a direction perpendicular to an a-b plane of the crystal, and metal atoms are arranged in a layered manner or metal atoms and oxygen atoms are arranged in a layered manner when seen from a direction perpendicular to c-axes of the crystal.

12. The semiconductor device according to claim 8, wherein the oxide semiconductor layer comprises at least one selected from the group consisting of an In-based metal oxide, a Zn-based metal oxide, an In—Zn-based metal oxide, and an In—Ga—Zn-based metal oxide.

13. The semiconductor device according to claim 8, further comprising a third oxide layer in contact with the side surface of the oxide semiconductor layer, wherein the oxide semiconductor layer is surrounded by the first oxide layer, the second oxide layer, and the third oxide layer.

14. The semiconductor device according to claim 13, wherein the third oxide layer is in contact with the gate insulating film, and wherein at least a part of a surface of the third oxide layer in contact with the gate insulating film is a curved surface.

15. The semiconductor device according to claim 8, further comprising:

a second transistor having a gate electrode layer electrically connected to the first drain electrode layer; and a third transistor having a gate electrode layer electrically connected to the second drain electrode layer, wherein electric charge accumulated in the gate electrode layer of the second transistor is held as first data in accordance with a potential of the first gate electrode layer, and wherein electric charge accumulated in the gate electrode layer of the third transistor is held as second data in accordance with a potential of the second gate electrode layer.

16. The semiconductor device according to claim 15, wherein the first data and the second data are two or more bits of data.

17. A semiconductor device comprising a first transistor, the first transistor comprising:

an oxide semiconductor layer over a substrate;

a source electrode layer over the oxide semiconductor layer;

a first drain electrode layer over the oxide semiconductor layer;

a second drain electrode layer over the oxide semiconductor layer;

a gate insulating film over the oxide semiconductor layer;

a first gate electrode layer over the gate insulating film, the first gate electrode layer overlapping with a part of the source electrode layer, the first drain electrode layer, and a part of the oxide semiconductor layer;

a second gate electrode layer over the gate insulating film, the second gate electrode layer overlapping with the other part of the source electrode layer, the second drain electrode layer, and the other part of the oxide semiconductor layer; and a third gate electrode layer over the gate insulating film, the third gate electrode layer overlapping with a first side surface of the oxide semiconductor layer;

wherein the first drain electrode layer and the second drain electrode layer are separated from each other by a space overlapping with the oxide semiconductor layer.

18. The semiconductor device according to claim 17, wherein the source electrode layer and the first drain electrode layer are placed in substantially parallel to a channel length direction of the first transistor, wherein the source electrode layer and the second drain electrode layer are placed in substantially parallel to the channel length direction of the first transistor, and wherein the first and the second gate electrode layers are placed in substantially parallel to a channel width direction of the first transistor.

19. The semiconductor device according to claim 17, wherein the oxide semiconductor layer comprises crystal, and wherein c-axes of the crystal are aligned in a direction parallel to a normal vector of a surface where the oxide semiconductor layer is formed or a normal vector of a surface of the oxide semiconductor layer.

20. The semiconductor device according to claim 17, wherein the oxide semiconductor layer comprises crystal, and wherein triangular or hexagonal atomic arrangement is formed when seen from a direction perpendicular to an a-b plane of the crystal, and metal atoms are arranged in a layered manner or metal atoms and oxygen atoms are arranged in a layered manner when seen from a direction perpendicular to c-axes of the crystal.

21. The semiconductor device according to claim 17, wherein the oxide semiconductor layer comprises at least one selected from the group consisting of an In-based metal oxide, a Zn-based metal oxide, an In—Zn-based metal oxide, and an In—Ga—Zn-based metal oxide.

22. The semiconductor device according to claim 17, further comprising:

a second transistor having a gate electrode layer electrically connected to the first drain electrode layer; and a third transistor having a gate electrode layer electrically connected to the second drain electrode layer, wherein electric charge accumulated in the gate electrode layer of the second transistor is held as first data in accordance with a potential of the first gate electrode layer, and wherein electric charge accumulated in the gate electrode layer of the third transistor is held as second data in accordance with a potential of the second gate electrode layer.

23. The semiconductor device according to claim 22, wherein the first data and the second data are two or more bits of data.

\* \* \* \* \*